United States Patent [19]
Terao et al.

[11] Patent Number: 6,005,772
[45] Date of Patent: Dec. 21, 1999

[54] COOLING APPARATUS FOR HIGH-TEMPERATURE MEDIUM BY BOILING AND CONDENSING REFRIGERANT

[75] Inventors: Tadayoshi Terao, Toyoake; Kazuo Kobayashi, Kariya; Hiroshi Tanaka, Toyoake; Kiyoshi Kawaguchi, Toyota, all of Japan

[73] Assignee: Denso Corporation, Kariya, Japan

[21] Appl. No.: 09/082,206

[22] Filed: May 20, 1998

[30] Foreign Application Priority Data

| May 20, 1997 | [JP] | Japan | 9-130020 |
| May 30, 1997 | [JP] | Japan | 9-141238 |
| May 30, 1997 | [JP] | Japan | 9-141301 |
| May 29, 1997 | [JP] | Japan | 9-139540 |
| May 29, 1997 | [JP] | Japan | 9-139570 |

[51] Int. Cl.$^6$ .................................................. H05K 7/20
[52] U.S. Cl. ........................ 361/699; 361/700; 257/714; 257/715; 165/80.4; 165/104.21; 165/104.33; 62/259.2
[58] Field of Search .................................. 361/698–700; 257/712, 714, 715, 716; 174/15.1, 15.2; 165/80.3, 80.4, 104.33; 62/104.21, 259.2

[56] References Cited

U.S. PATENT DOCUMENTS

| 5,168,919 | 12/1992 | Berenholz et al. | 165/80.4 |
| 5,458,189 | 10/1995 | Larson et al. | 165/104.33 |
| 5,613,552 | 3/1997 | Osakabe et al. | 165/104.21 |
| 5,647,430 | 7/1997 | Tajima | 165/104.33 |
| 5,713,413 | 2/1998 | Osakabe et al. | 165/104.33 |
| 5,720,338 | 2/1998 | Larson et al. | 361/700 |
| 5,729,995 | 3/1998 | Tajima et al. | 62/259.2 |
| 5,764,483 | 6/1998 | Ohashi et al. | 361/699 |
| 5,823,248 | 10/1998 | Kadota et al. | 361/700 |
| 5,832,989 | 11/1998 | Osakabe et al. | 1665/104.33 |
| 5,836,381 | 11/1998 | Osakabe et al. | 361/700 |
| 5,871,043 | 2/1999 | Osakabe et al. | 361/700 |

FOREIGN PATENT DOCUMENTS

| 56-147457 | 11/1981 | Japan . |
| 7-161888 | 6/1995 | Japan . |
| 8-78589 | 3/1996 | Japan . |
| 8-255857 | 10/1996 | Japan . |
| 8-264692 | 10/1996 | Japan . |

*Primary Examiner*—Donald Sparks
*Assistant Examiner*—Boris L. Chervinsky
*Attorney, Agent, or Firm*—Harness, Dickey & Pierce, PLC

[57] ABSTRACT

In a cooling apparatus, a radiating part mounted on a refrigerant tank is made by stacking refrigerant tubes and fins alternately. A first header and a second header are provided at the ends of the refrigerant tubes. When the cooling apparatus is used in a vertical attitude, the first header is positioned above the liquid surface of refrigerant inside the refrigerant tank, and the second header is positioned below the liquid surface. Consequently, vapor refrigerant boiled by heat from a heat-emitting body attached to the refrigerant tank can flow through the first header into the refrigerant tubes, and liquid refrigerant liquefied in the refrigerant tubes can flow through the second header back to the refrigerant tank.

5 Claims, 35 Drawing Sheets

LIQUID SURFACE

REFRIGERANT

COOLING APPARATUS FOR HIGH-TEMPERATURE MEDIUM BY BOILING AND CONDENSING REFRIGERANT

CROSS REFERENCE TO THE RELATED APPLICATIONS

This application is based on and incorporates herein by reference Japanese Patent Application Nos. Hei 9-130020 filed on May 20, 1997, Hei 9-139540 filed on May 29, 1997, Hei 9-139570 filed on May 29, 1997, Hei 9-141238 filed on May 30, 1997, and Hei 9-141301 filed on May 30, 1997.

BACKGROUND OF THE INVENTION

1. Field of the Invention

The present invention relates to a cooling apparatus for a high-temperature medium by boiling and condensing refrigerant, capable of absorbing heat generated from a high-temperature medium such as a heating body of a semiconductor device or electric device, to cool the high-temperature medium.

2. Description of the Related Art

A cooling apparatus for a high-temperature medium by boiling and condensing refrigerant is disclosed in JP-A-56-147457. This cooling apparatus has a sealed vessel containing liquid refrigerant and a condensing vessel connected to this sealed vessel by two heat transport pipes, and this condensing vessel is made up of a plurality of tubes and a pair of headers. In this apparatus, vapor refrigerant boiled and vaporized by heat from a heat-emitting body is guided through one of the heat transport pipes to the condensing vessel, is cooled and liquefied as it flows through the tubes of the condensing vessel, and flows back to the sealed vessel through the other heat transport pipe. By this means, heat from the heat-emitting body is transported to the condensing vessel by the boiling and condensing action of the refrigerant and released from the tubes through the fins to an outside fluid.

When a CPU used in a personal computer or the like is to be cooled by the cooling apparatus, the board on which the CPU is mounted is not always disposed horizontally and there are cases wherein it is mounted vertically, and in these cases it becomes necessary for the mounting face of the cooling apparatus to which the CPU is attached to be disposed vertically also.

However, in the related art unit described above, because design anticipating the apparatus being used with the heat-emitting body mounting face vertical has not been carried out, when the apparatus is actually used in such an attitude (a vertical attitude), a sufficient cooling performance cannot be attained. That is, when the apparatus as a whole is used stood up so that the heat-emitting body mounting face is vertical, the two heat transport pipes are both at about the same height as the refrigerant liquid surface and vapor of refrigerant boiled in the sealed vessel and liquid refrigerant liquefied in the condensing vessel cannot circulate smoothly and consequently the cooling capacity of the unit falls.

Another cooling apparatus constituting is disclosed in JP-A-8-255857. This cooling apparatus is constructed by stacking a plurality of press-formed plate members and has a refrigerant tank and a plurality of radiating parts. The radiating parts are each formed in the shape of a flat container using two plate members and are disposed in parallel sandwiching fins between them and are connected to each other through refrigerant passages formed at their ends.

However, in the related art unit described above, openings forming the refrigerant passages of the radiating parts are made by deep drawing of a press die. With this method, to obtain the gaps necessary for disposing the fins, it is necessary to make the diameters of the openings large. As a result, because the area over which the fins can be disposed decreases, there has been the problem that it is not possible to obtain a large effective heat transfer area for the overall size of the cooling vessel.

Another cooling apparatus is disclosed in JP-A-7-161888. This cooling apparatus has a refrigerant tank containing liquid refrigerant and a condensing vessel for cooling vapor of refrigerant boiled in this refrigerant tank by heat from a heat-emitting body, and this condensing vessel is provided integrally with the refrigerant tank.

For example inside the casing of a computer, numerous boards on which semiconductor devices are mounted are disposed vertically and with a narrow spacing, and it is difficult to mount the whole of the cooling apparatus inside this kind of narrow space. However, with the related art cooling apparatus described above, because the condensing vessel and the refrigerant tank are integrated, it is impossible for the condensing vessel to be disposed in a position away from the refrigerant tank or for the attitude of the condensing vessel to be changed, and consequently there has been the problem that the cooling apparatus cannot be used in the kind of narrow space described above.

Another cooling apparatus is disclosed in JP-A-8-78589. This cooling apparatus has a refrigerant tank containing liquid refrigerant and a condensing vessel mounted on the top of this refrigerant tank, and the condensing vessel is mounted inclined at an angle of approximately 90° to the refrigerant tank. In this condensing vessel, refrigerant tubes and fins are disposed alternately, headers are connected to openings at the ends of the refrigerant tubes, and the refrigerant tubes are connected together through these headers.

However, in this related art apparatus, because the condensing vessel is mounted inclined at about 90° to the refrigerant tank, when the amount of heat produced by the heat-emitting body is large the size of the condensing vessel becomes large. In particular, when the height of the condensing vessel becomes great, it cannot be used to cool a heat-emitting body installed in a narrow space between boards like a computer chip or the like.

Also, in this related art apparatus, an upper end opening of the refrigerant tank is connected to one of the headers. Because it is inserted into this header from a direction 90° different from the refrigerant tubes, the size of this header becomes large and the proportion of the heat-radiation area with respect to the size of the unit overall becomes small.

And, because the condensing vessel is mounted on the refrigerant tank inclined at about 90° with respect thereto, there has been the problem that assembling it from one direction is difficult and the assemblability thereof is thus poor.

SUMMARY OF THE INVENTION

It is therefore a first object of the present invention to provide a cooling apparatus which suffers little reduction in capacity even when used in an attitude such that its heat-emitting body mounting face is substantially vertical.

According to a first aspect of the present invention, in the cooling apparatus, a plurality of headers connecting a refrigerant tank and a plurality of refrigerant tubes disposed in parallel connect the refrigerant tubes together in a direction substantially perpendicular to the refrigerant tubes, and when the unit is used in an attitude such that the refrigerant tubes are substantially vertical the whole or a part of at least one of the headers is positioned above the refrigerant liquid surface and the whole or a part of at least one other of the headers is positioned below the refrigerant liquid surface. In this case, vapor of refrigerant boiled by heat from the heat-emitting body can flow into the refrigerant tubes through the header positioned above the refrigerant liquid surface. Liquid refrigerant liquefied as it flows through the refrigerant tubes can flow back to the refrigerant tank through the header positioned below the refrigerant liquid surface. As a result, even when the apparatus is used in an attitude such that the refrigerant tubes are substantially vertical, because vapor refrigerant and liquid refrigerant can circulate smoothly without interfering, an ample heat-radiating performance can be ensured.

It is a second object of the present invention to provide a cooling apparatus in which a large effective heat transfer area can be obtained for the size of the overall condensing vessel.

According to the second aspect of the present invention, headers for connecting together a plurality of refrigerant tubes each consist of a plurality of tubular collar members interposed between refrigerant tubes disposed in parallel with fins therebetween and connect together connecting openings of plate members forming the refrigerant tubes. In this aspect of the present invention, because the plate members forming the refrigerant tubes and the collar members are provided separately, the height of the collar members (the distance between the refrigerant tubes disposed in parallel with the fins therebetween) can be set freely irrespective of the sizes of the openings in the plate members. Therefore, because gaps necessary for disposing the fins can be provided without the diameters (although the sectional shape of the connecting openings does not have to be circular and may alternatively be oval) of the connecting openings being made unnecessarily large, the area over which the fins are disposed is not reduced and it is possible to obtain a large effective heat transfer area for the size of the condensing vessel overall.

It is a third object of the invention to provide a cooling apparatus with which the condensing vessel can be disposed in a position away from the refrigerant tank and the attitude of the condensing vessel can be changed.

According to a third aspect of the present invention, the refrigerant tank and the condensing vessel are connected by a connecting member, and consequently it is possible for the condensing vessel to be disposed in a position away from the refrigerant tank. As a result, when the heat-emitting body is disposed in a narrow space, the refrigerant tank can be disposed in the narrow space and the condensing vessel can be disposed in a larger space. Also, the connecting member connecting the refrigerant tank and the condensing vessel is flexibly deformable so that the attitude of the condensing vessel can be changed to correspond with a direction in which air is blown onto the condensing vessel.

It is a fourth object of the present invention to provide a cooling apparatus with which the overall height of the apparatus can be kept low.

According to a fourth aspect of the present invention, the refrigerant tank and the condensing vessel are disposed substantially in parallel and a gap for cooling air blown over the condensing vessel to pass through is formed between the refrigerant tank and the condensing vessel. As a result, because a flow of cooling air can be supplied to the condensing vessel even when the condensing vessel is disposed substantially parallel with the refrigerant tank, compared to related art apparatuses wherein the refrigerant tank and the condenser are mounted substantially perpendicularly, the overall height of the unit can be kept low.

It is a fifth object of the present invention to provide a cooling apparatus with which a large heat-radiating area of the condensing part can be obtained with respect to the size of the overall apparatus and which has good assemblability.

According to a fifth aspect of the present invention, a refrigerant tank and refrigerant tubes are extruded members each provided in a hollow shape having two open ends and are disposed substantially in parallel and pointing in the same direction. The connecting members consist of a connecting member to which one open end of the refrigerant tank and one open end of each refrigerant tube are both connected and another connecting member to which the other open end of the refrigerant tank and the other open end of each refrigerant tube are both connected, and the connecting members are each made by joining together two press-formed components.

With this construction, because extruded members are used for the refrigerant tank and the refrigerant tubes, mold costs can be reduced. And, as a result of extruded members being used, in the refrigerant tank, flatness of the mounting face to which the heat-emitting body is attached can be obtained easily, and the refrigerant tubes can be made thin and their heat-radiating area made large. Also, because the connecting members are constructed by joining together two press-formed components, they can be made thin. As a result, because the connecting members can be made small, a large heat-radiating area can be obtained for the size of the overall apparatus.

Because the construction is a simple one made by just assembling the connecting members to the open ends of the refrigerant tank and the refrigerant tubes, the manufacturing assembly is easy.

BRIEF DESCRIPTION OF THE DRAWINGS

Additional objects and advantages of the present invention will be more readily apparent from the following detailed description of preferred embodiments thereof when taken together with the accompanying drawings in which.

DETAILED DESCRIPTION OF THE PREFERRED EMBODIMENTS

Figure 1:
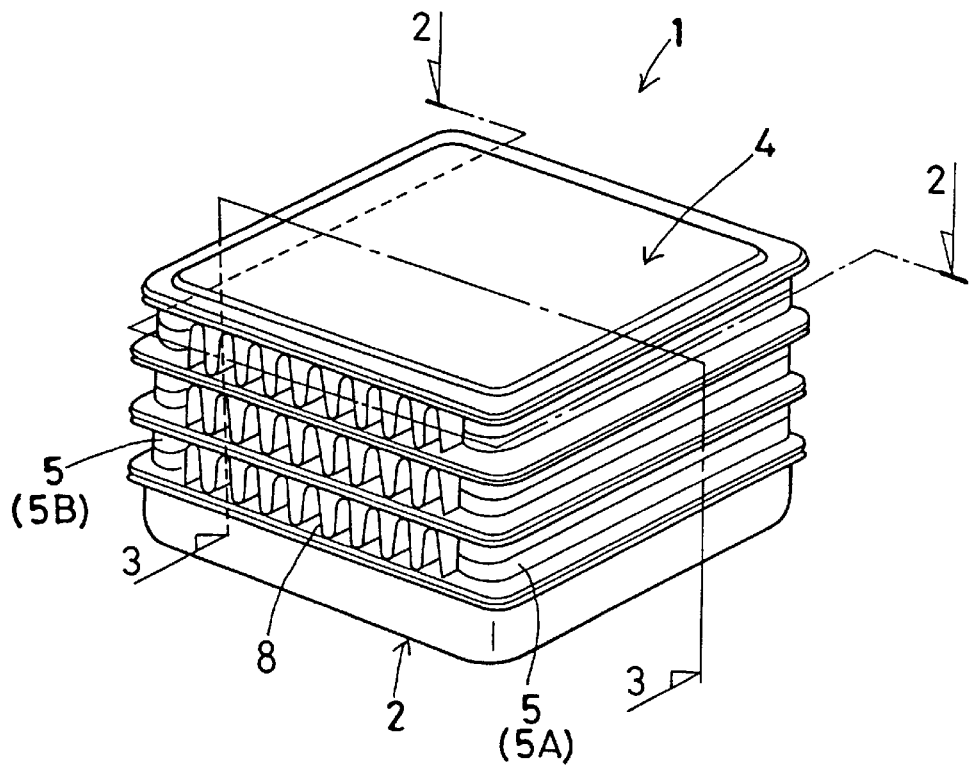
FIG. 1 is a perspective view showing a cooling apparatus according to a first embodiment.

Referring to the drawings, preferred embodiments of the present invention will be described.

(First Preferred Embodiment)

FIG. 1 is a perspective view showing a cooling apparatus 1 according to a first embodiment. The cooling apparatus 1 cools a high-temperature medium by boiling and condensing refrigerant.

The cooling apparatus 1 has a refrigerant tank 2, a radiating part, and two headers 5 (first header 5A and second header 5B). The refrigerant tank 2 contains a liquid refrigerant. The radiating part condenses the refrigerant boiled in the refrigerant tank 2 by heat of from a heat-emitting body 3 (see FIG. 3) and radiates heat thereof. The headers 5A, 5B communicate the refrigerant tank 2 with refrigerant tubes 4 (see FIG. 3).

Figure 3:
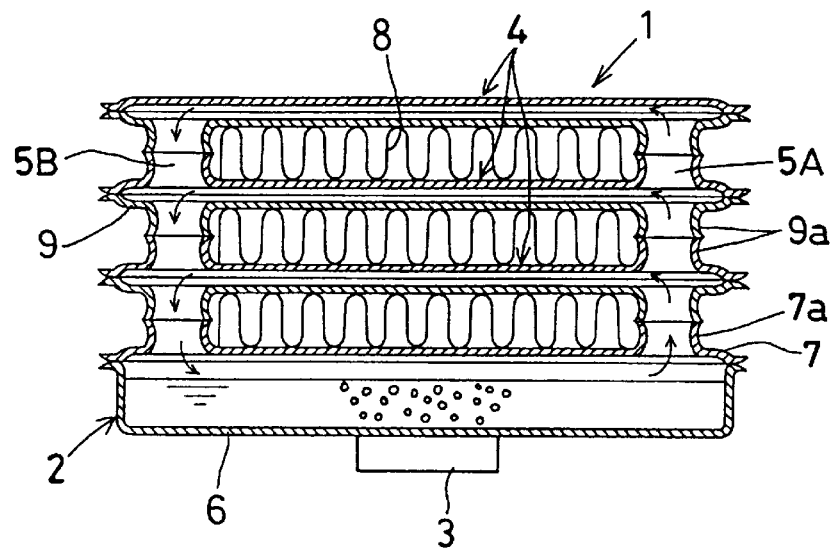
FIG. 3 is a cross sectional view taken along line 3—3 in FIG. 1.

The refrigerant tank 2, as shown in FIG. 3, includes a vessel 6 having an opening at the upper side thereof and a plate member 7 covering the opening the vessel 6. These are formed by pressing a sheet of metal such as aluminum having excellent thermal conductivity. Orifice parts 7a projecting beyond the surface of the plate member 7 and having their ends open are provided at the cross width direction (the left-right direction of FIG. 3) left and right sides of the plate member 7. These orifice parts 7a are long-by-narrow and extend along the respective sides of the plate member 7.

This refrigerant tank 2 is rectangular (approximately square) in plan shape, and has a flat box shape such that the gap from the plate member 7 to the bottom of the vessel 6 is small with respect to the cross width of this plan shape.

The radiating part has the refrigerant tubes 4, through the insides of which the refrigerant flows, and fins 8 for emitting heat (latent heat of condensation) of the refrigerant to an outside fluid (outside air). The radiating part is constructed by the plurality of refrigerant tubes 4 and the plurality of fins 8 being disposed alternately, as shown in FIG. 3.

The refrigerant tubes 4 are each formed in a flat, hollow shape by two press-formed plate members 9 being joined together at their edges. The plan shape of the refrigerant tubes 4 is the same rectangle as that of the refrigerant tank 2 (an approximate square).

Figure 2:
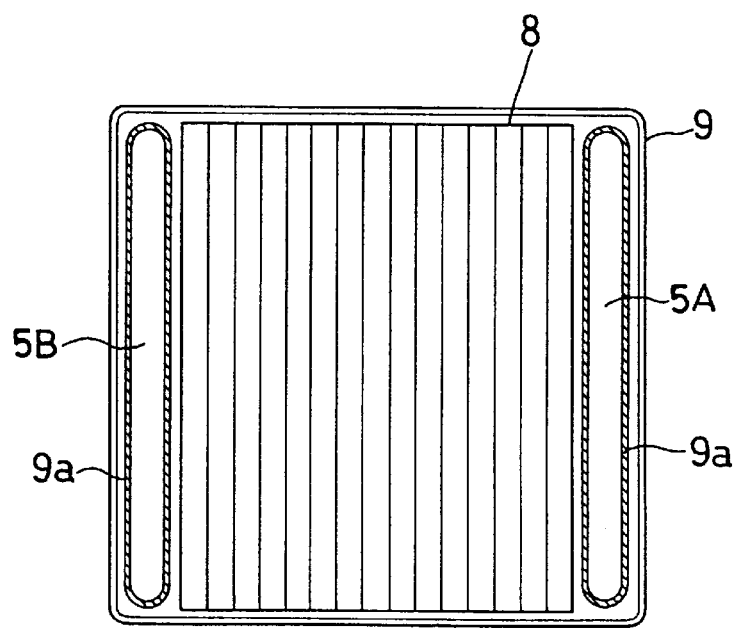
FIG. 2 is a cross sectional view taken along line 2—2 in FIG. 1.

The plate members 9 of the refrigerant tank 2, except for the plate member 9 disposed at the outermost in the radiating part (uppermost in FIG. 3), are formed in the same shape as the plate member 7. As shown in FIG. 2, orifice parts 9a are provided at the cross width direction left and right sides of each of the plate members 9. No orifice parts are provided in the plate member 9 disposed at the outermost in the radiating part.

The refrigerant tubes 4 are stacked on the refrigerant tank 2 by the orifice parts 9a being brought face to face.

The fins 8 are made by corrugating into a wavy shape a thin sheet of a metal such as for example aluminum, and are interposed between adjacent refrigerant tubes 4 and between the lowermost refrigerant tube 4 and the refrigerant tank 2.

The headers 5 are formed by the orifice parts 7a, 9a stacked in the same direction as the refrigerant tank 2 and the refrigerant tubes 4 and connect the refrigerant tubes 4 to each other and to the refrigerant tank 2.

The cooling apparatus 1 is manufactured by stacking the vessel 6 and the plate member 7 forming the refrigerant tank 2, the plate members 9 forming the refrigerant tubes 4 and the headers 5, and the fins 8 in the same direction to assemble its overall shape and then integrally brazing this assembly.

The heat-emitting body 3 is for example a CPU used in a personal computer or the like, and is fixed in intimate contact with a central part of the bottom face of the refrigerant tank 2.

Figure 4:
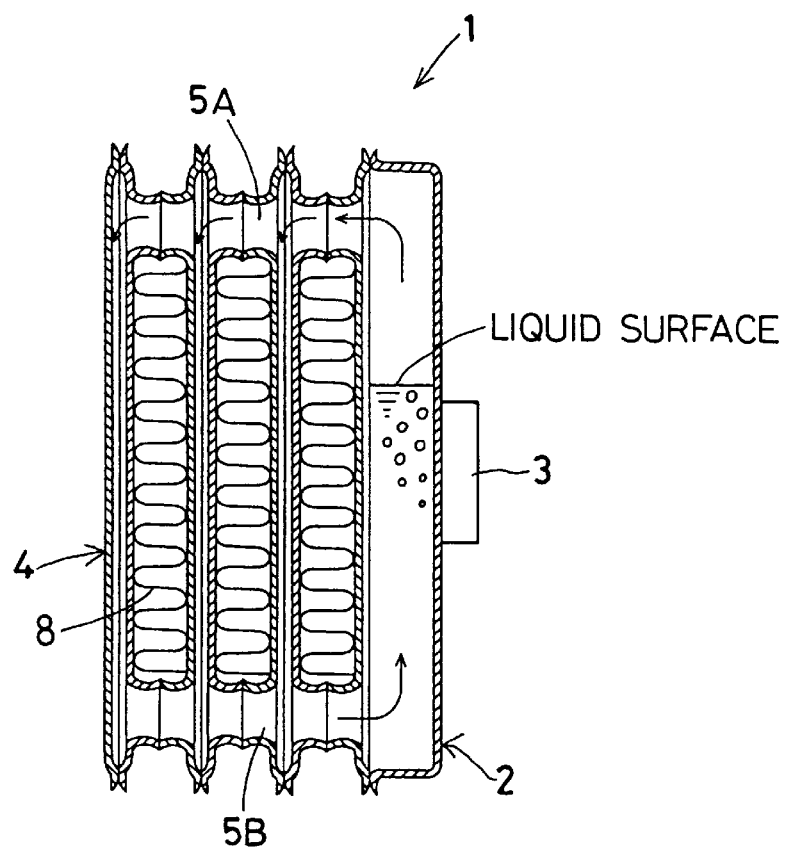
FIG. 4 is a cross sectional view (taken along line 3—3 in FIG. 1) of the cooling apparatus used in a vertical attitude.

As the refrigerant, water, alcohol, a fluorocarbon, or freon or the like is used, and this is charged into the refrigerant tank 2 through a filling pipe (not shown). However, the refrigerant is filled to a position lower than the plate member 7 of the refrigerant tank 2 (a space is provided between the liquid surface and the plate member 7). Also, preferably, when the refrigerant-filled heat sink unit 1 is used in a vertical attitude, as shown in FIG. 4, the liquid surface inside the refrigerant tank 2 is above the position where the heat-emitting body 3 is mounted.

An operation of the first embodiment will be described.

a) When the cooling apparatus 1 is used with the bottom face of the refrigerant tank 2, to which the heat-emitting body 3 is fixed, substantially horizontal (the state shown in FIG. 3):

Refrigerant boiled and vaporized by heat from the heat-emitting body 3, as shown with arrows in FIG. 3, flows through the gap between the liquid surface inside the refrigerant tank 2 and the plate member 7 into the first header 5A, and from the first header 5A into the refrigerant tubes 4. The vapor refrigerant having flowed into the refrigerant tubes 4 condenses on the inner walls of the refrigerant tubes 4 and forms liquid droplets, and these are pushed by the flow of the vapor refrigerant and flow through the refrigerant tubes 4 toward the second header 5B. The liquid refrigerant having flowed from the refrigerant tubes 4 into the second header 5B descends through the second header 5B back to the liquid refrigerant inside the refrigerant tank 2 and repeats the cycle described above (boiling-condensing-liquefaction).

In this way, the heat transmitted to the refrigerant from the heat-emitting body 3 is released as latent heat of condensation as the vapor refrigerant condenses inside the refrigerant tubes 4 and is emitted from the walls of the refrigerant tubes 4 through the fins 8 into the atmosphere.

b) Electronic devices such as CPUs likely to constitute the heat-emitting body 3 generally are most frequently used in a horizontal or vertical (90°) attitude, and vary rarely are used in an attitude other than 0° or 90°. Thus, as shown in FIG. 4, there are cases wherein the cooling apparatus 1 is used in such an attitude that the bottom face of the refrigerant tank 2, to which the heat-emitting body 3 is fixed, is substantially vertical.

In this case, the refrigerant boiled and vaporized in the refrigerant tank 2, as shown with arrows in FIG. 4, ascends through the space inside the upper portion of the refrigerant tank 2, and flows into the first header 5A, and from the first header 5A into the refrigerant tubes 4. The vapor refrigerant having flowed into the refrigerant tubes 4 condenses on the inner walls of the refrigerant tubes 4 and forms liquid droplets, and these drip down the inner walls of the refrigerant tubes 4 under gravity. The liquid refrigerant having dripped down the insides of the refrigerant tubes 4 flows through the second header 5B back into the refrigerant tank 2 and repeats the cycle described above (boiling-condensing-liquefaction).

In this way, the heat transmitted to the refrigerant from the heat-emitting body 3 is released as latent heat of condensation as the vapor refrigerant condenses inside the refrigerant tubes 4 and is emitted from the walls of the refrigerant tubes 4 through the fins 8 into the atmosphere.

In the first embodiment, because the first and second headers 5A, 5B are provided at both ends of the refrigerant tubes 4, when the cooling apparatus 1 is used in a vertical attitude (the attitude shown in FIG. 4), the first header 5A is positioned above the liquid surface and the second header 5B is positioned below the liquid surface. Consequently, the vapor refrigerant boiled by heat from the heat-emitting body 3 can flow into the refrigerant tubes 4 through the first header 5A, and the refrigerant liquefied in the refrigerant tubes 4 can flow through the second header 5B back to the refrigerant tank 2. In this way, because the vapor refrigerant and liquid refrigerant can circulate smoothly without interfering, an ample radiating performance can be provided.

Also, because the cooling apparatus 1 of the first embodiment has a stack construction made by stacking the vessel 6 and the plate member 7 forming the refrigerant tank 2, the plate members 9 forming the refrigerant tubes 4 and the headers 5, and the fins 8 in the same direction, its manufacture is easy (it can be manufactured simply by integral brazing).

(Second Embodiment)

Figure 5:
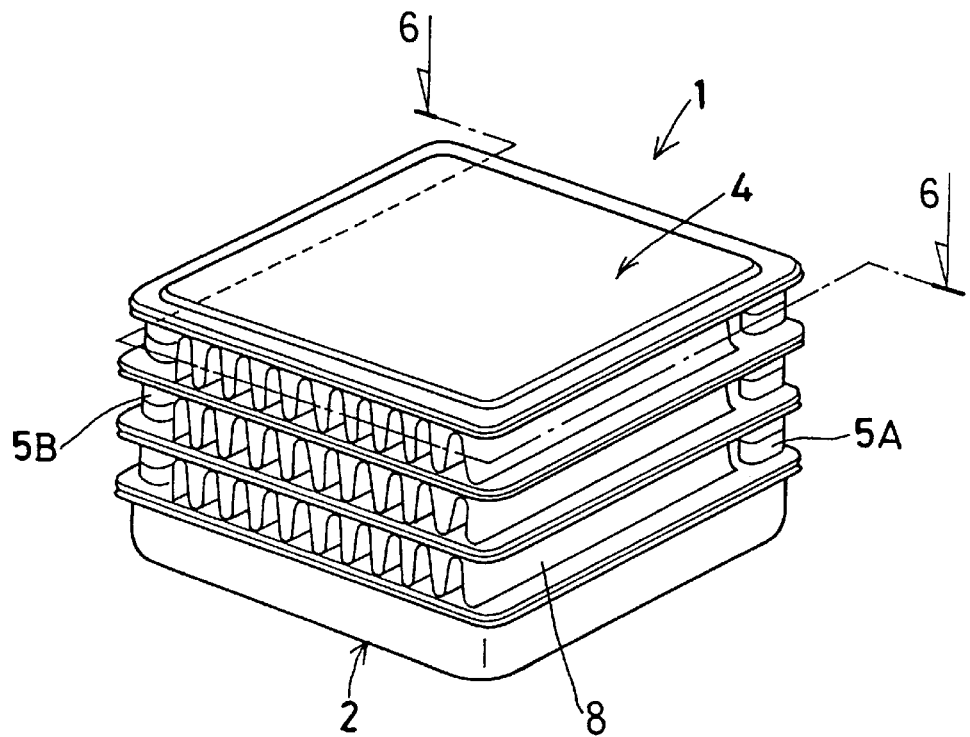
FIG. 5 is a perspective view showing a cooling apparatus according to a second embodiment.

FIG. 5 is a perspective view showing a cooling apparatus 1 according to a second embodiment.

Figure 6:
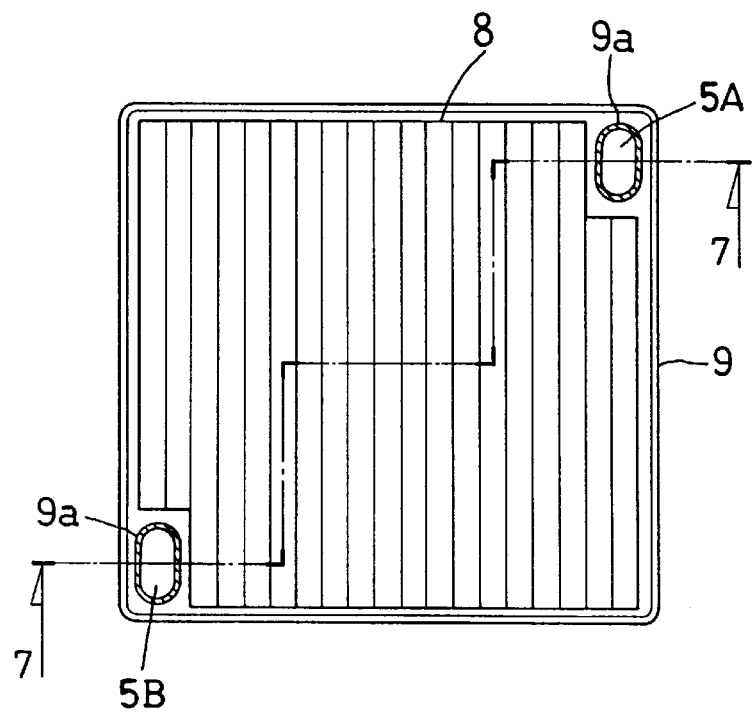
FIG. 6 is a cross sectional view taken along line 6—6 in FIG. 5.

In the second embodiment, the first header 5A and the second header 5B are provided in diagonally opposite positions with respect to the refrigerant tubes 4. That is, in the second embodiment, as shown in FIG. 6, the headers 5A, 5B are provided only at corners of the refrigerant tubes 4, and the first header 5A and the second header 5B are provided in diagonally opposite positions.

Figure 7:
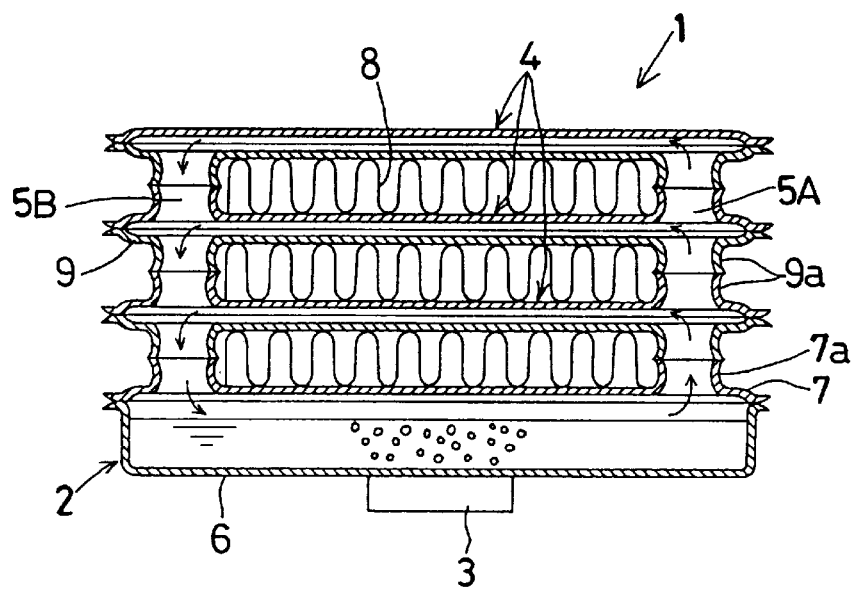
FIG. 7 is a cross sectional view taken along line 7—7 in FIG. 6.

As a result, when the cooling apparatus 1 is used in a horizontal attitude (see FIG. 7), in the same way as in the first embodiment, the refrigerant boiled and vaporized in the refrigerant tank 2 flows from the first header 5A into the refrigerant tubes 4, and liquefies as it flows through the refrigerant tubes 4, and flows back through the second header 5B into the refrigerant tank 2.

Figure 8:
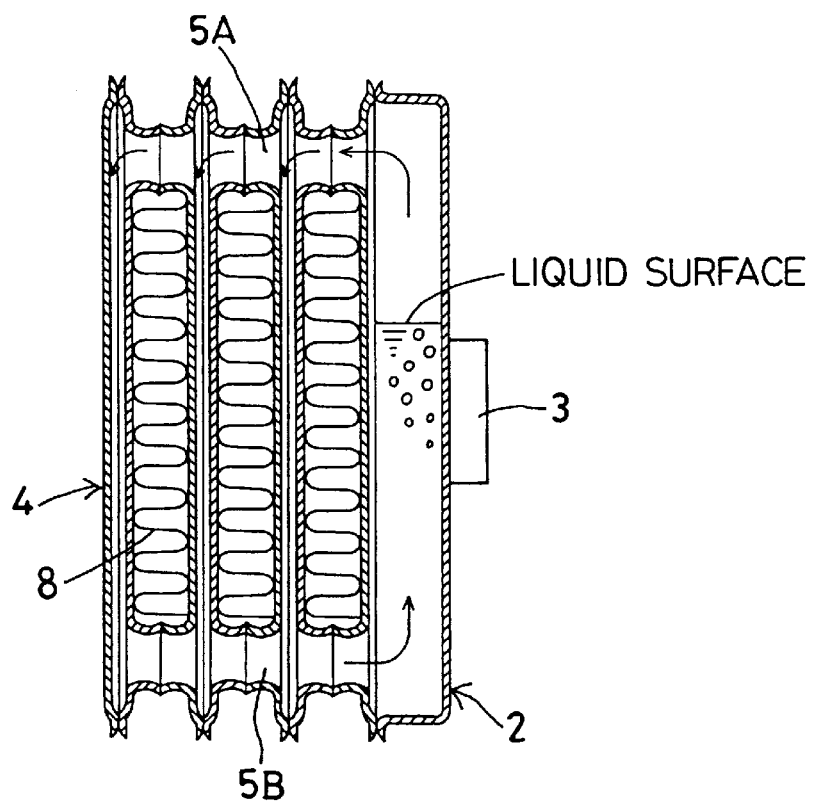
FIG. 8 is a cross sectional view (taken along line 7—7 in FIG. 6) of the cooling apparatus used in a vertical attitude.

When the cooling apparatus is used in a substantially vertical attitude (see FIG. 8), because the first header 5A or the second header 5B is positioned above the liquid surface and the other header 5B or 5A is positioned below the liquid surface, in the same way as in the first embodiment, the vapor refrigerant and liquid refrigerant can circulate smoothly without interfering.

(Third Embodiment)

Figure 9:
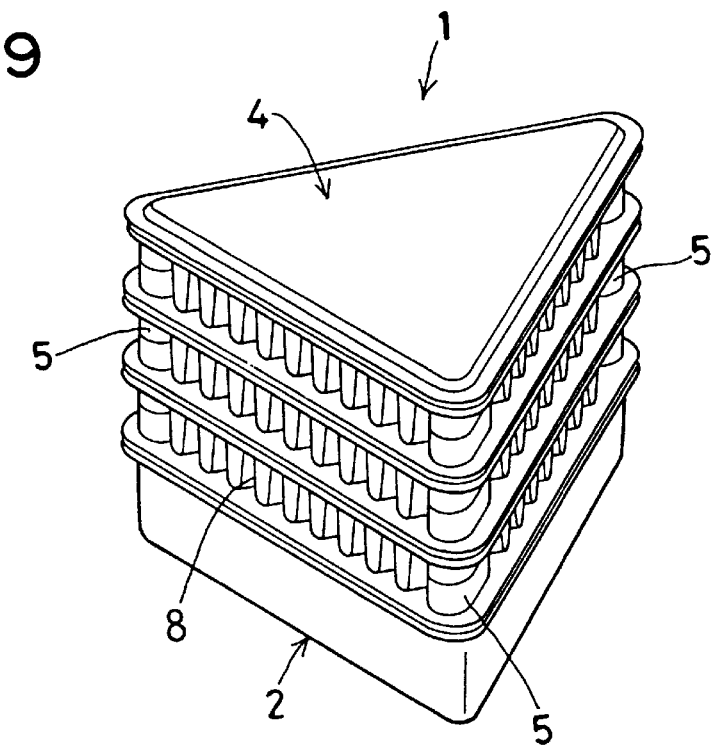
FIG. 9 is a perspective view showing a cooling apparatus according to a third embodiment.

FIG. 9 is a perspective view showing a cooling apparatus 1 according to third embodiment.

The third embodiment shows an example of a case wherein the plan shape of the refrigerant tubes 4 and the refrigerant tank 2 is made substantially triangular. In this case, by providing a header 5 at each of the vertices of the triangle, even when the cooling apparatus 1 is used in a vertical attitude, because always one or two of the headers 5 are positioned above the liquid surface and the remaining one or two headers 5 are positioned below the liquid surface, it is possible to form a circulating flow of refrigerant.

(Fourth Embodiment)

Figure 10:
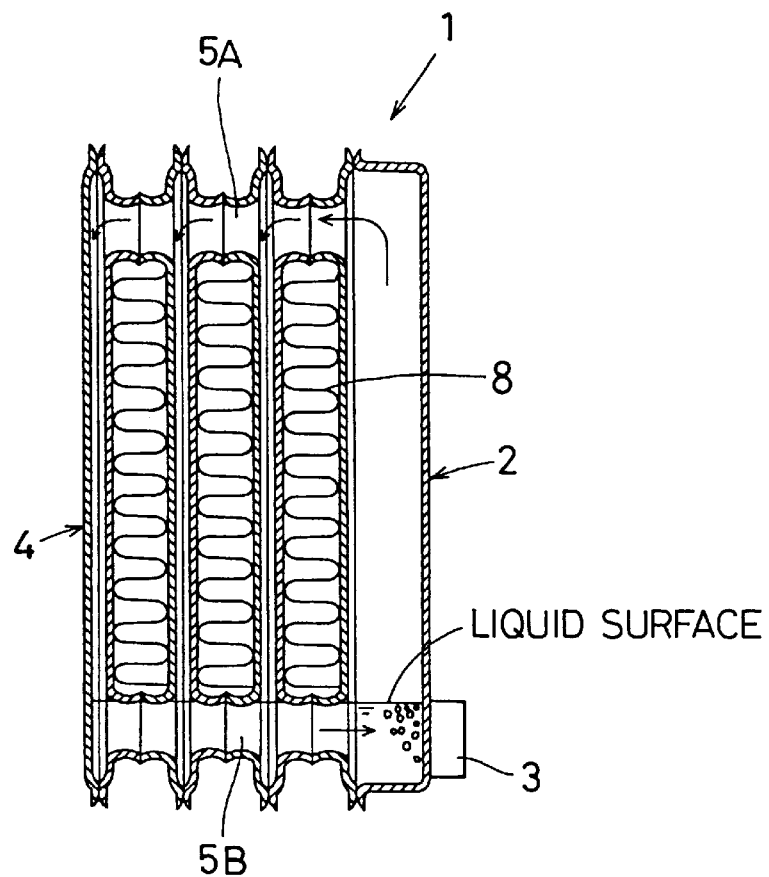
FIG. 10 is a cross sectional view showing a cooling apparatus according to a fourth embodiment.

FIG. 10 is a sectional view of a cooling apparatus 1 according to a fourth embodiment.

In the fourth embodiment, when the cooling apparatus 1 is used in a vertical attitude, as shown in FIG. 10, the liquid surface is below the fins 8 of the radiating part, and also the heat-emitting body 3 is mounted below the liquid surface. That is, because the radiating part has the function of radiating heat to the atmosphere through the fins 8, to maintain the heat-radiating performance thereof, the whole of the radiating part is preferably above the liquid surface. To this end, the amount of the refrigerant charge is reduced so that when the cooling apparatus 1 is stood up, the liquid surface is lower than the fins 8 of the radiating part. In other words, it is necessary to design the volume of the header 5B and the volume and the height of the refrigerant tank 2 and so on, not only of course so that the cooling apparatus 1 can be used in a horizontal state, but also so that the lower header 5B is filled with liquid refrigerant and the liquid surface is lower than the lower ends of the fins 8 when the cooling apparatus 1 is stood up.

By this means, because the whole of the radiating part can be used effectively, an ample heat-radiating performance can be attained. Also, by mounting the heat-emitting body 3 below the liquid surface even when the liquid surface is low, the heat from the heat-emitting body 3 can be effectively transmitted to the liquid refrigerant.

Figure 11:
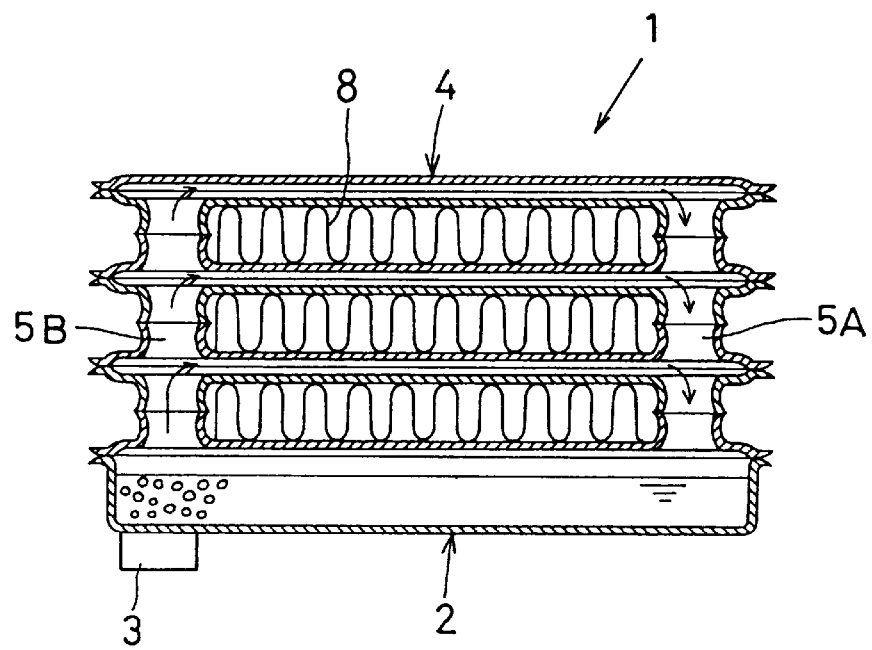
FIG. 11 is a cross sectional view showing the cooling apparatus used in a horizontal attitude (fourth embodiment)

In this case, because the mounting position of the heat-emitting body 3 is close to the second header 5B, when the cooling apparatus 1 is used in a horizontal attitude as shown in FIG. 11, vapor of the refrigerant boiled by heat from the heat-emitting body 3 tends to flow to the second header 5B. As a result, the circulation of the vapor refrigerant and liquid refrigerant occurs more smoothly and a good circulating flow can be attained, and consequently the heat-sinking performance improves.

(Fifth Embodiment)

Figure 12:
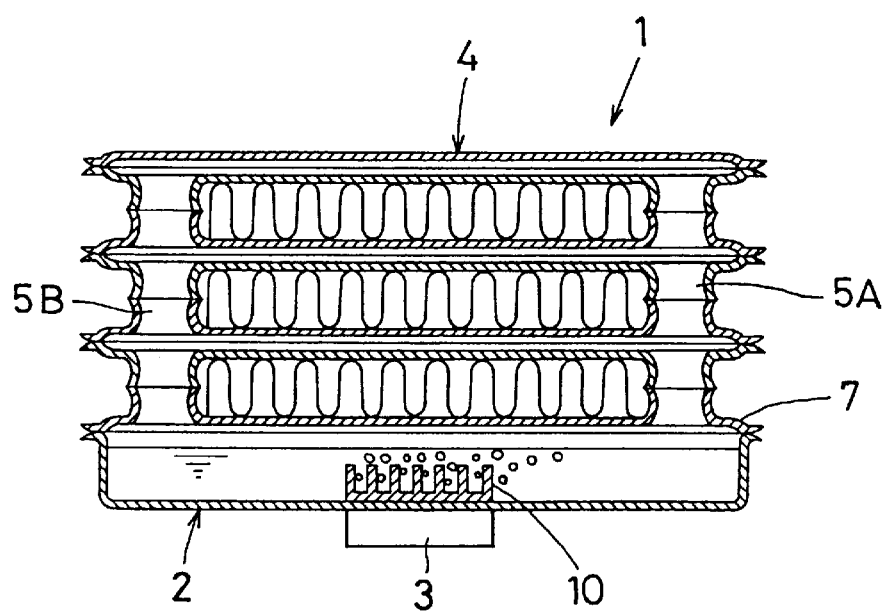
FIG. 12 is a cross sectional view showing a cooling apparatus according to a fifth embodiment.

FIG. 12 is a sectional view showing a cooling apparatus 1 according to a fifth embodiment.

The fifth embodiment shows an example of a case wherein a fin member 10 is provided in a boiling part (a part corresponding to where the heat-emitting body 3 is mounted) of the inside of the refrigerant tank 2. The fin member 10 is made up of multiple barlike-members or platelike-members, and is mounted extending from the bottom of the refrigerant tank 2 toward the plate member 7 side. In this case, there is the effect that heat from the heat-emitting body 3 is efficiently transmitted to the refrigerant and the refrigerant contact area is enlarged.

(Sixth Embodiment)

Figure 13:
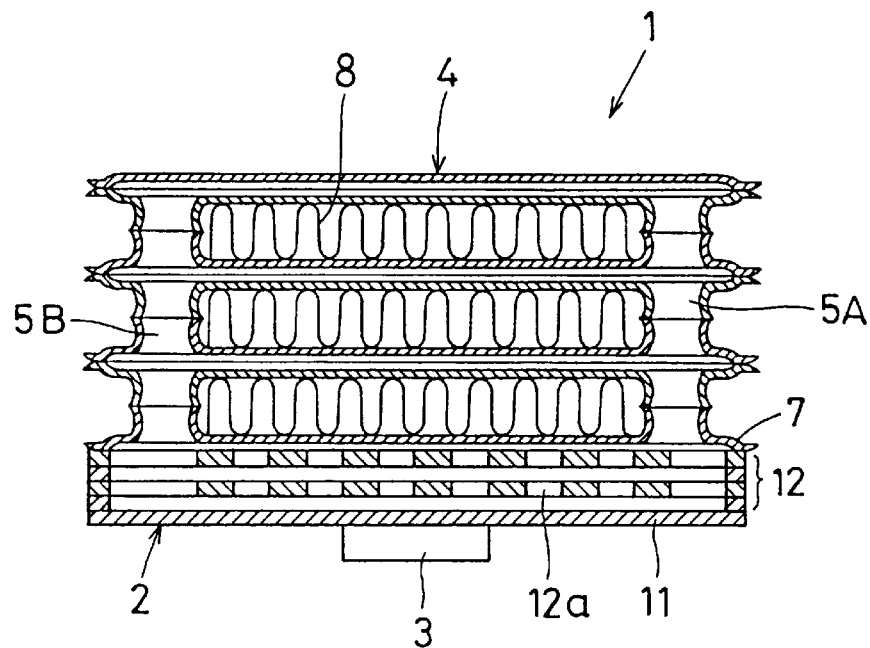
FIG. 13 is a cross sectional view showing a cooling apparatus according to a sixth embodiment.

FIG. 13 is a sectional view showing a cooling apparatus 1 according to a sixth embodiment.

In the sixth embodiment, the vessel 6 part of the refrigerant tank 2 described in the first embodiment is made up of a plurality of flat plate members.

The flat plate members consist of a bottom plate 11 forming the bottom of the refrigerant tank 2 and a plurality of plates 12 in which are formed slits 12a, and the plates 12 are stacked on the bottom plate 11 so that the slits 12a of adjacent plates 12 intersect. In this case, the area of contact with the refrigerant in the boiling part of the refrigerant tank 2 can be enlarged and heat transfer can be improved. Consequently, the refrigerant can be made to boil over a large surface area in a large region and an increase in performance can be achieved. And, because pillar parts of the plates 12 (between the slits 12a) are stacked between the bottom plate 11 and the plate member 7, there is also the effect that the refrigerant tank 2 is strong.

(Seventh Embodiment)

Figure 14:
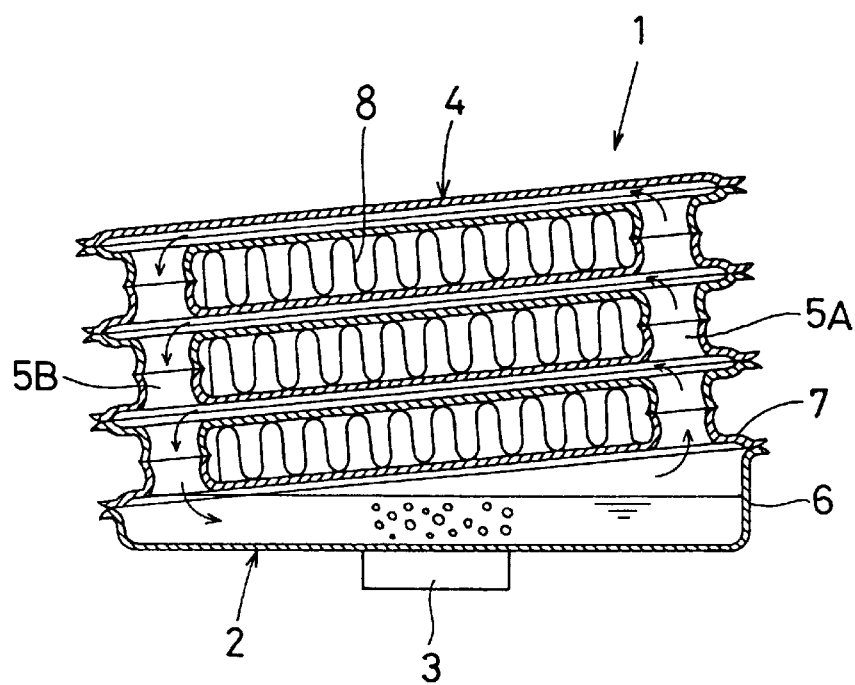
FIG. 14 is a cross sectional view showing a cooling apparatus according to a seventh embodiment.

FIG. 14 is a sectional view showing a cooling apparatus 1 according to a seventh embodiment.

The seventh embodiment shows an example of a case wherein the refrigerant tubes 4 are mounted at a predetermined angle of inclination with respect to the bottom face of the refrigerant tank 2 so that the bottom face of the refrigerant tank 2 (the face to which the heat-emitting body 3 is mounted) and the refrigerant tubes 4 are not parallel. Specifically, as shown in FIG. 14, the height (depth) of the vessel 6 of the refrigerant tank 2 is gradually changed to make the plate member 7 joined thereto incline together with the whole of the radiating part.

As a result, even when the heat-emitting body 3 is used in a horizontal attitude, i.e. when the bottom face of the refrigerant tank 2 to which the heat-emitting body 3 is mounted is in a horizontal state, the liquid refrigerant having condensed inside the refrigerant tubes 4 is moved downward along the inclined refrigerant tubes 4 by gravity. Consequently, it is possible to prevent the liquid refrigerant from stagnating inside the refrigerant tubes 4.

Also, as a result of the height of the vessel 6 of the refrigerant tank 2 being gradually changed to make the plate member 7 incline, vapor of the refrigerant having boiled inside the refrigerant tank 2 tends to flow along the inclined plate member 7 into the header 5A in the higher position. Further, the liquid refrigerant flows down the refrigerant tubes 4 toward the header 5B in the lower position, and consequently an effect of the refrigerant circulation being promoted can be expected. An effect of enabling the liquid refrigerant to be moved inside the refrigerant tubes 4 by gravity can be obtained if the inclination angle of the refrigerant tubes 4 with respect to the bottom face (the horizontal face) of the refrigerant tank 2 is about five degrees.

(Eighth Embodiment)

Figure 15:
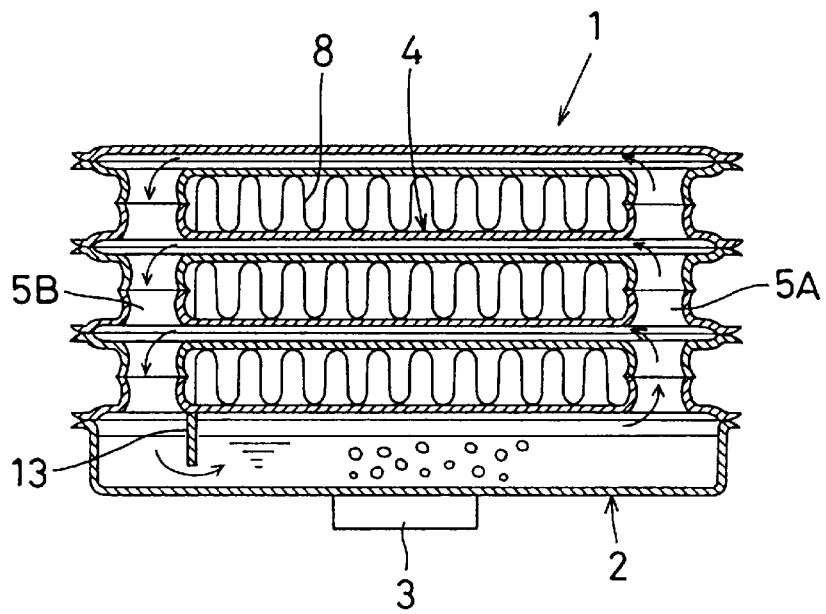
FIG. 15 is a cross sectional view showing a cooling apparatus according to an eighth embodiment.

FIG. 15 is a sectional view showing a cooling apparatus 1 according to an eighth embodiment.

In the eighth embodiment, a partition plate 13 dividing the space above the liquid surface is provided between the opening of the second header 5B (or the first header 5A) at the refrigerant tank 2 (the opening of an orifice part 7a provided in the plate member 7) and the boiling part (the region where the refrigerant boils the most) inside the refrigerant tank 2. In this case, since the vapor refrigerant boiled in the boiling part cannot flow into the second header 5B because it is blocked by the partition plate 13, it must flow into the first header 5A. As a result, the flow of the vapor refrigerant is not dispersed and becomes a one-way flow. Consequently, a good circulatory flow of the refrigerant can be attained. And, because the liquid refrigerant having condensed inside the refrigerant tubes 4 is pushed in the flow direction of the vapor refrigerant at a high pressure, it can be returned to the refrigerant tank 2 without stagnating inside the refrigerant tubes 4.

(Ninth Embodiment)

Figure 16:
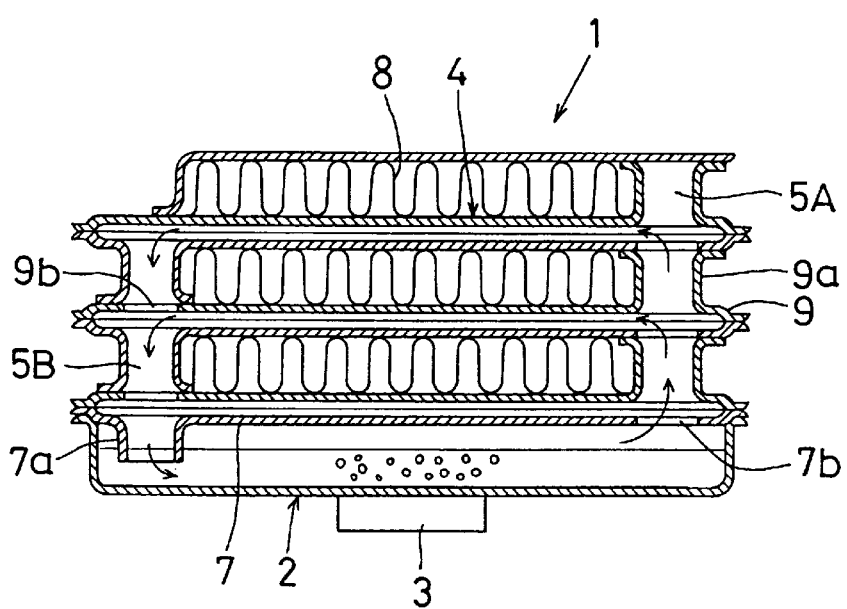
FIG. 16 is a cross sectional view showing a cooling apparatus according to a ninth embodiment.

FIG. 16 is a sectional view showing a cooling apparatus 1 according to a ninth embodiment.

The ninth embodiment is an example wherein orifice parts 7a, 9a are provided in one location only in the plate member 7 of the refrigerant tank 2 and in each of the plate members 9 forming the refrigerant tubes 4; holes 7b, 9b are formed in the other location only; and the plate members 7, 9 are stacked with alternating orientation so that the orifice parts 7a, 9a and the holes 7b, 9b face each other. However, the orifice part 7a provided on the plate member 7 is provided pointing toward the inside of the refrigerant tank 2 so that the lower end of the second header 5B (or the first header 5A) projects to below the liquid surface inside the refrigerant tank 2.

In this case, it is possible to control the flow of refrigerant and attain a good circulatory flow of refrigerant without using the partition plate 13 described in the eighth embodiment. Further, because the liquid refrigerant having condensed inside the refrigerant tubes 4 is pushed in the flow direction of the vapor refrigerant at a high pressure, it can be returned to the refrigerant tank 2 without stagnating inside the refrigerant tubes 4.

(Tenth Embodiment)

Figure 17:
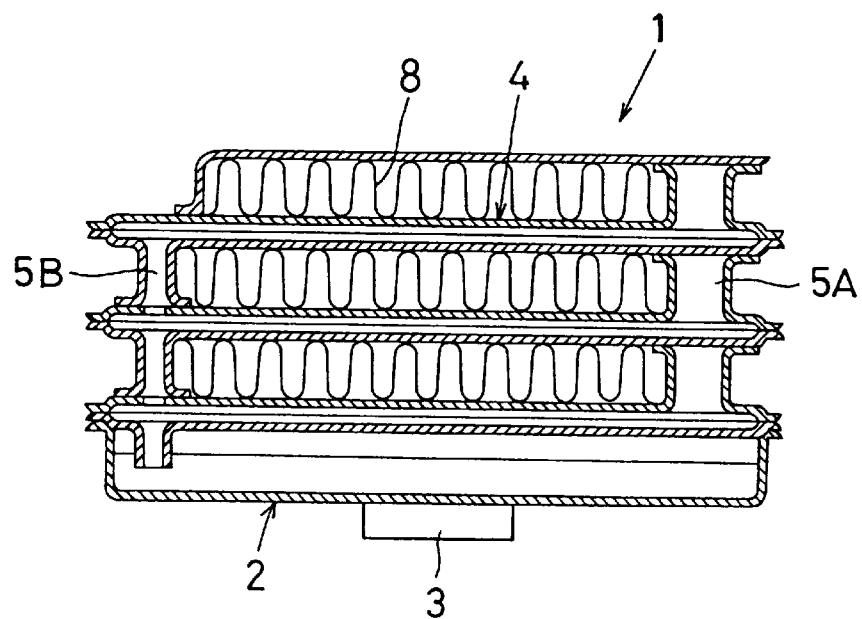
FIG. 17 is a cross sectional view showing a cooling apparatus according to a tenth embodiment.

FIG. 17 is a sectional view showing a cooling apparatus 1 according to a tenth embodiment.

The tenth embodiment shows an example of a case wherein, with respect to the construction described above in the ninth embodiment, the passage sectional areas (the thicknesses of the headers 5) of the first header 5A into which the vapor refrigerant flows and the second header 5B into which the liquid refrigerant flows are made different. That is, because the flow amount of the circulating refrigerant is constant in both of the headers 5, due to the difference in specific gravity between the vapor refrigerant and the liquid refrigerant, the volume of the vapor side is much larger and the flow speed is faster, and consequently pressure loss tends to occur on this vapor side. Therefore, it is possible to form a smoother circulatory flow of the refrigerant by making the first header 5A, through which the vapor refrigerant passes, thick.

(Eleventh Embodiment)

Figure 18:
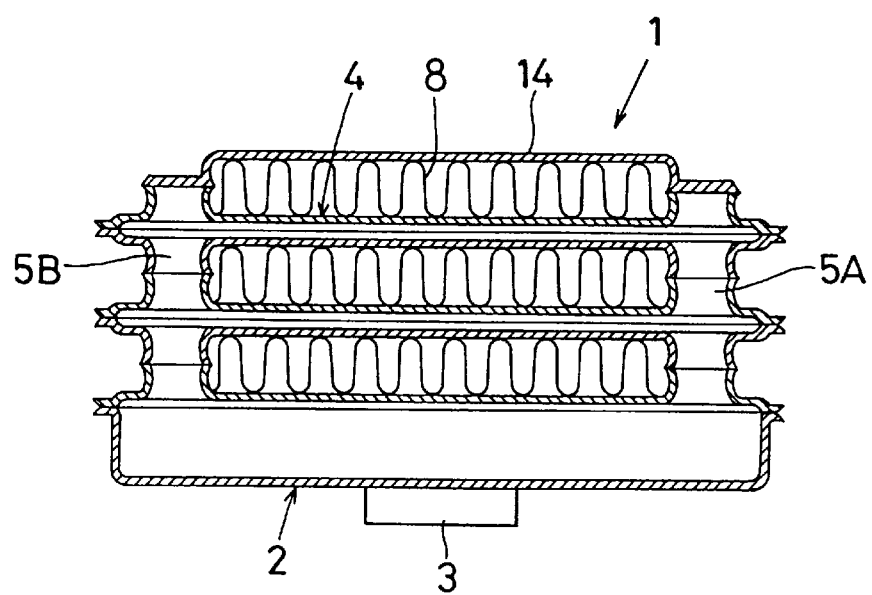
FIG. 18 is a cross sectional view showing a cooling apparatus according to an eleventh embodiment.

FIG. 18 is a sectional view showing a cooling apparatus according to an eleventh embodiment.

The eleventh embodiment shows an example of a case wherein no refrigerant tube 4 is provided in the uppermost part of the radiating part (the uppermost part of FIG. 18), and a plate 14 is used instead. In this case, because a fin 8 is disposed on either side of every refrigerant tube 4, all the refrigerant tubes 4 are supported by fins 8. In the structure shown in FIG. 3, on the other hand, because no fin 8 is disposed on the upper side of the refrigerant tube 4 disposed in the uppermost part of the radiating part, this uppermost refrigerant tube 4 is at a disadvantage in a pressure tightness compared with the other refrigerant tubes 4. Therefore, by using the plate 14 for the uppermost part of the radiating part, as shown in FIG. 18, it is possible to provide a cooling apparatus 1 having a higher pressure tightness. Needless to say, the number of refrigerant tubes 4 can be suitably increased or decreased according to the amount of heat produced by the heat-emitting body 3.

(Twelfth Embodiment)

Figure 19A:
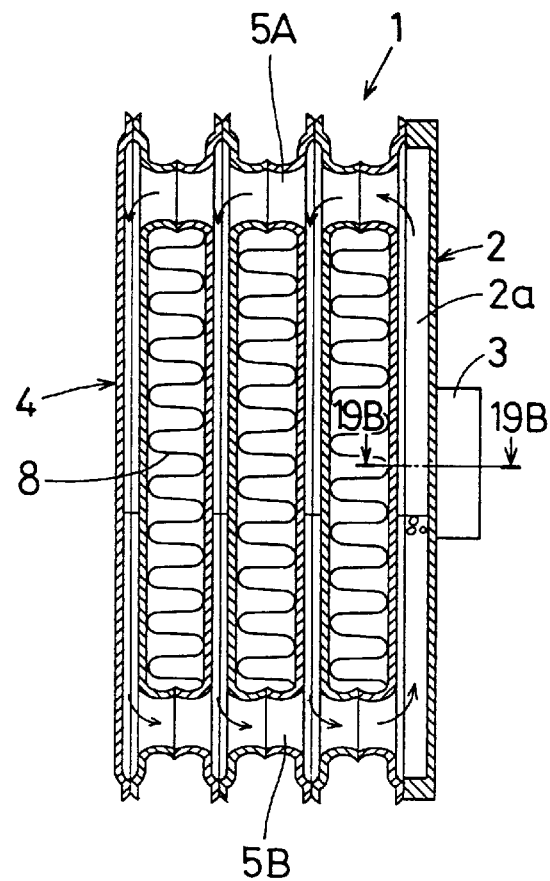
FIG. 19A is a cross sectional view showing a cooling apparatus according to a cooling apparatus according to a twelfth embodiment.
Figure 19B:
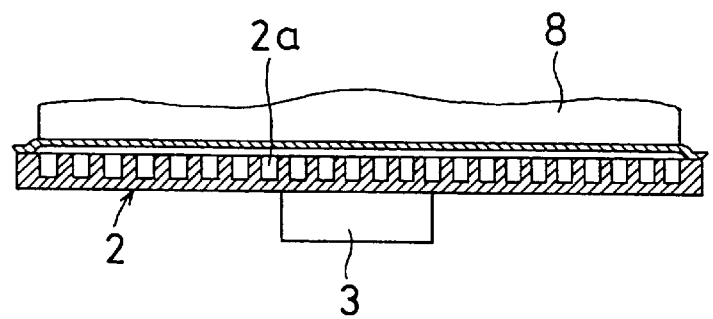
FIG. 19B is a cross sectional view taken along line 19B—19B in FIG. 19A.

FIG. 19A is a cross sectional view showing a cooling apparatus 1 according to a twelfth embodiment. FIG. 19B is a cross sectional view taken along line 19B—19B in FIG. 19A.

The twelfth embodiment shows an example of a case wherein the thickness of the refrigerant tank 2 (left-right direction width in FIG. 19A) is made thin and multiple narrow pipelike-passages 2a (see FIG. 19B) are provided inside the refrigerant tank 2. These pipelike-passages 2a are formed by providing ribs or the like inside the refrigerant tank 2, and extend in the same direction as the refrigerant tubes 4 to communicate with the first header 5A to the second header 5B.

By this means, when the cooling apparatus 1 is used in a vertical attitude, even though the mounting position of the heat-emitting body 3 is above the liquid surface, refrigerant can be sucked upwardly and guided as far as the vicinity of the heat-emitting body 3 by capillary forces of the pipelike-passages 2a. Also, the refrigerant boiled by heat transmitted from the heat-emitting body 3 becomes bubbles and ascends the insides of the pipelike-passages 2a, and the liquid refrigerant also is pulled by this foam and ascends at the same time and can boil where the heat-emitting body 3 is mounted. Thus, because the refrigerant is sucked up by capillary forces of the pipelike-passages 2a when the cooling apparatus 1 is used in a vertical attitude, boiling can continue where the heat-emitting body 3 is mounted even when the liquid surface is below the mounting position of the heat-emitting body 3. As a result, because is possible for the liquid surface to be set low, a large effective area (radiating area) of the radiating part appearing above the liquid surface can be secured.

(Thirteenth Embodiment)

Figure 20:
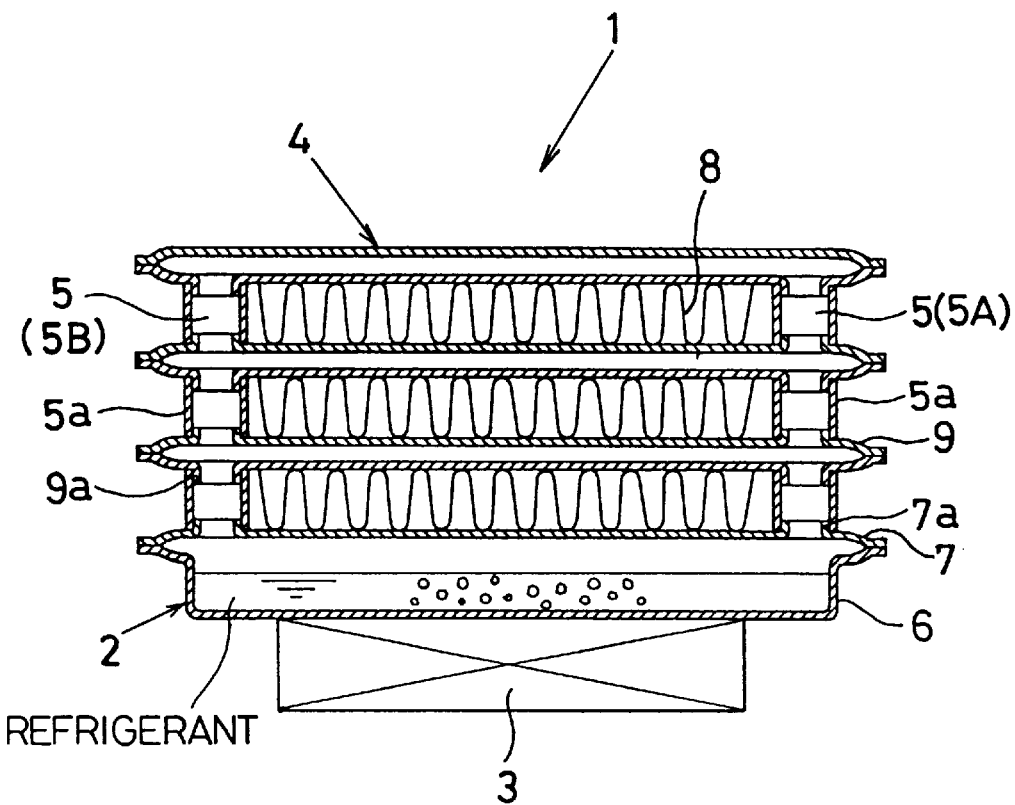
FIG. 20 is a cross sectional view showing a cooling apparatus according to thirteenth embodiment.

A thirteenth embodiment will be described, referring to FIG. 20 through FIG. 22.

Figure 21:
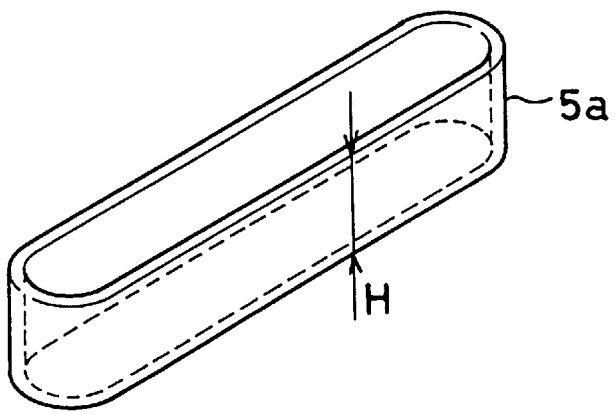
FIG. 21 is a perspective view showing a collar member.
Figure 22:
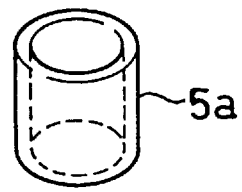
FIG. 22 is a perspective view showing a modified version collar member.

In the thirteenth embodiment, the headers 5 consist of long-by-narrow tubular collar members 5a shown in FIG. 21 and are interposed between the adjacent refrigerant tubes 4 and between the lowermost refrigerant tube 4 and the refrigerant tank 2. The collar members 5a are fitted around the orifice parts 9a and the orifice parts 7a, and connect together the adjacent orifice parts 9a, and the lowermost orifice parts 9a and the orifice parts 7a. The collar members 5a have a height H (see FIG. 21) sufficient for a gap necessary for disposing a fin 8 to be obtained.

This cooling apparatus 1 is manufactured by stacking the vessel 6 and the plate member 7 forming the refrigerant tank 2, the plate members 9 forming the refrigerant tubes 4, the collar members 5a forming the headers 5, and the fins 8 in the same direction to assemble an overall shape thereof and then integrally brazing this assembly.

In the thirteenth embodiment, the collar members 5a are interposed between the adjacent refrigerant tubes 4 disposed in parallel sandwiching fins 8, and between the lowermost refrigerant tube 4 and the refrigerant tank 2. These collar members 5a connect together the adjacent orifice parts 9a of the refrigerant tubes 4, and the orifice parts 9a of the lowermost refrigerant tube 4 and the orifice parts 7a of the refrigerant tank 2. Therefore, if the height H of the collar members 5a is set to a height sufficient for gaps necessary for disposing the fins 8 to be obtained, it is not necessary for the end faces of the orifice parts 9a, 7a to be brought face to face (made to abut) with each other, and the heights of the orifice parts 9a, 7a can be made low. As a result, because the external diameters (connecting opening diameters) of the orifice parts 9a, 7a can be made small, it is possible to correspondingly increase the area over which the fins 8 are disposed and obtain a greater effective heat transfer area for the overall size of the radiating part. In particular, when the cooling apparatus 1 is used to cool a small heat-emitting body 3 such as a CPU, the size of the cooling apparatus 1 is about 70 mm×70 mm, and because the fin area of the radiating part also becomes small, being able to increase the area over which the fins 8 are disposed by reducing the external diameters of the orifice parts 9a, 7a is effective in securing heat-radiating performance.

Also, because the cooling apparatus 1 of this thirteenth embodiment has a stack structure made by stacking the vessel 6 and the plate member 7 forming the refrigerant tank 2, the plate members 9 forming the refrigerant tubes 4, the collar members 5a forming the headers 5, and the fins 8 in the same direction, its manufacture is easy (it can be manufactured simply by integral brazing).

(Modification Example)

In the thirteenth embodiment described above, the collar members 5a were made long-by-narrow tubes to match the shape of the orifice parts 7a, 9a provided on the plate members 7, 9. However, alternatively, the orifice parts 7a, 9a may be made circular in cross sectional shape and the collar members 5a may be made the cylindrical shape shown in FIG. 22. Also, although in the thirteenth embodiment described above, the plate members 7, 9 are provided with orifice parts 7a, 9a, these may alternatively be just holes (connecting openings).

(Fourteenth Embodiment)

Figure 23:
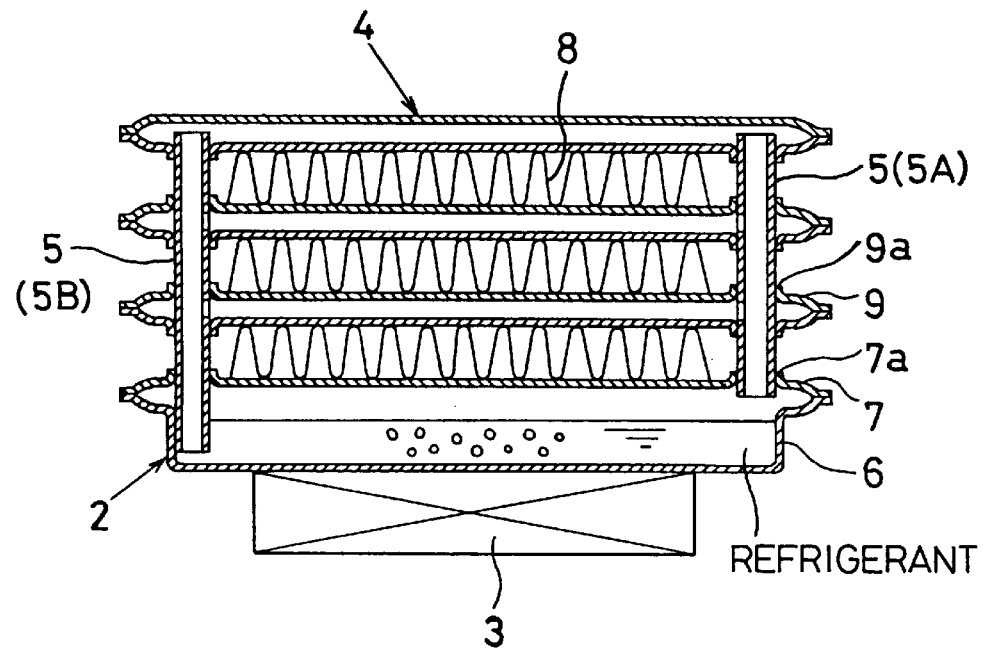
FIG. 23 is a cross sectional view showing a cooling apparatus according to a fourteenth embodiment.

FIG. 23 is a cross sectional view showing a cooling apparatus 1 according to a fourteenth embodiment.

Figure 24:
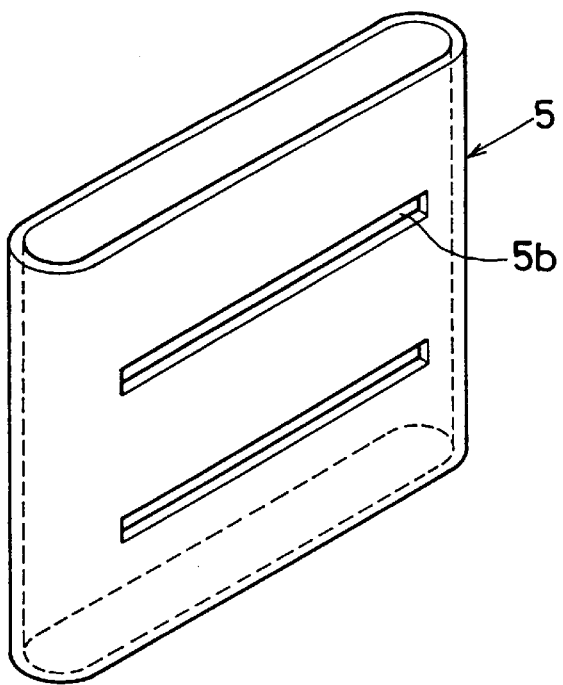
FIG. 24 is a perspective view showing a collar member.

In the fourteenth embodiment, the headers 5 are provided as flat pipes shown in FIG. 24, and pass through the orifice parts 7a, 9a formed on the plate members 7, 9 to connect the refrigerant tank 2 with the refrigerant tubes 4. Long-by-narrow openings 5b are formed in the side faces of the headers 5 where they pass through the insides of the refrigerant tubes 4, and the headers 5 are connected to the refrigerant tubes 4 through these openings 5b.

In this fourteenth embodiment, because the headers 5 and the refrigerant tubes 4 are connected through openings 5b formed in the headers 5, if the positions of the openings 5b are set according to the height of the fins 8, it is possible to secure the gaps required for disposing the fins 8 irrespective of the sizes (the heights and external diameters) of the orifice parts 7a, 9a of the plate members 7, 9. As a result, as in the thirteenth embodiment, because it is possible to reduce the external diameters of the orifice parts 9a, 7a (the diameters of the connecting openings), it is possible to increase the area over which the fins 8 are disposed and obtain a greater effective heat transfer area for the overall size of the radiating part.

Also, if one of the headers 5 is made longer than the other so that its lower end is positioned below the refrigerant liquid surface as shown in FIG. 23, the vapor refrigerant flows into the other header and returns to the refrigerant tank 2 through the longer header after condensing into a liquid. By adopting this kind of construction, it is possible to make the refrigerant flow circulate naturally and increase the heat-radiating performance of the cooling apparatus 1.

(Modification Example)

Figure 25:
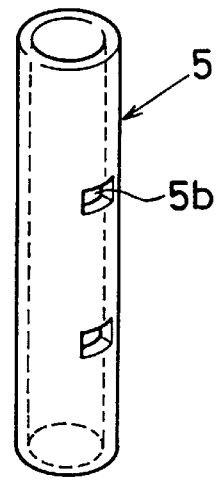
FIG. 25 is a perspective view showing a modified version a collar member.

In the fourteenth embodiment described above, the headers 5 were made flat pipes to match the shapes of the orifice parts 7a, 9a provided on the plate members 7, 9. However, alternatively, the orifice parts 7a, 9a may be made circular in cross sectional shape, and the headers 5 may be made a cylindrical shape shown in FIG. 25. Also, although in the fourteenth embodiment described above, the plate members 7, 9 are provided with orifice parts 7a, 9a, these may alternatively be just holes (connecting openings).

(Fifteenth Embodiment)

Figure 26:
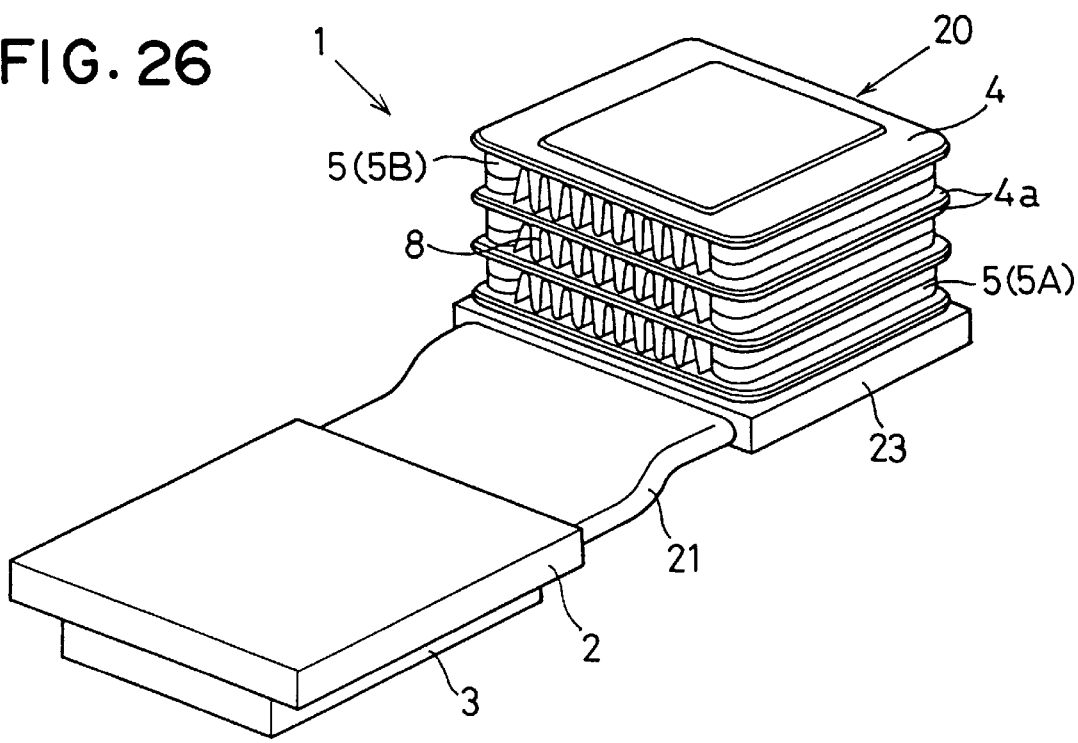
FIG. 26 is a perspective view showing a cooling apparatus according to a fifteenth embodiment.

FIG. 26 is a perspective view showing a cooling apparatus 1 according to a fifteenth embodiment.

The cooling apparatus 1 of the fifteenth embodiment is made up of a refrigerant tank 2 containing a liquid refrigerant, a condensing vessel 20 for cooling and liquefying the vapor refrigerant boiled in the refrigerant tank 2, and a connecting member 21 connecting together the condensing vessel 20 and the refrigerant tube 4.

Figure 28:
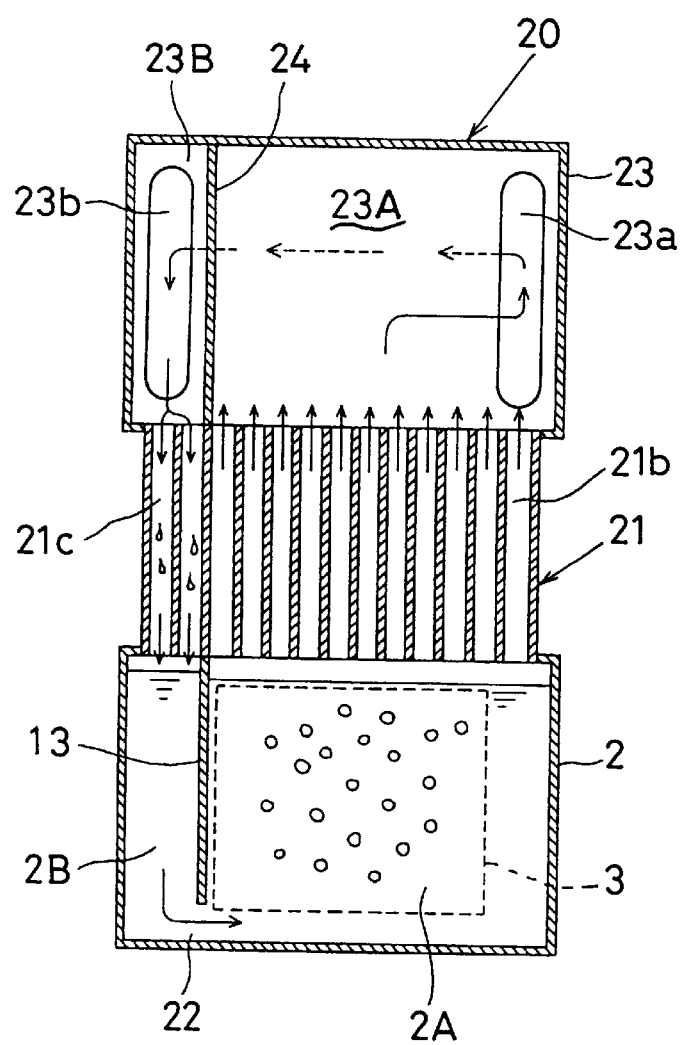
FIG. 28 is a cross sectional view showing a cooling apparatus according to the fifteenth embodiment.

The refrigerant tank 2 is formed in the shape of a flat box and is open at one face (upper end face thereof), and has inside it a partition plate 13 (see FIG. 28). This partition plate 13 divides the inside of the refrigerant tank 2 into a boiling region 2A (a region mainly corresponding to the area where the heat-emitting body 3 is mounted) where refrigerant is boiled by heat from the heat-emitting body 3 and a liquid refrigerant inflow region 2B into which the liquid refrigerant having been liquefied in the condensing vessel 20 flows. The partition plate 13, as shown in FIG. 28, extends downward from the upper end face of the refrigerant tank 2. Here, a flow aperture 22 is provided between the lower end of the partition plate 13 and the bottom face of the inside of the refrigerant tank 2 so that the liquid refrigerant in the liquid refrigerant inflow region 2B can move into the boiling region 2A.

The condensing vessel 20, as shown in FIG. 26, is made up of a radiating part constructed by a plurality of refrigerant tubes 4 and a plurality of fins 8 being superposed alternately, and a tank part 23 connected to this radiating part.

The refrigerant tubes 4 are each formed in a flat hollow shape by two press-formed plate members 4a being joined together at their edges, and headers 5 (first header 5A and second header 5B) for connecting the refrigerant tubes 4 together are provided at the length-direction ends of the refrigerant tubes 4.

The fins 8 are made by corrugating into a wavy shape a thin sheet of metal such as aluminum, and are interposed between the adjacent refrigerant tubes 4.

The tank part 23 connects the refrigerant tubes 4 of the radiating part to the connecting member 21, and is formed in a flat box shape similar to that of the refrigerant tank 2. The connecting member 21 connects to the side face of the tank part 23, and the radiating part connects to an obverse face thereof. The tank part 23 has connecting openings 23a, 23b formed at opposite ends of the obverse face to which the radiating part is connected (see FIG. 28), and connects with the headers 5 of the refrigerant tubes 4 through these connecting openings 23a, 23b. A partition plate 24 is provided inside the tank part 23 and divides the inside of the tank part 23 into a first space 23A connecting with the connecting opening 23a and a second space 23B connecting with the other connecting opening 23b. Here, as shown in FIG. 28, the first space 23A is larger than the second space 23B.

Figure 27:
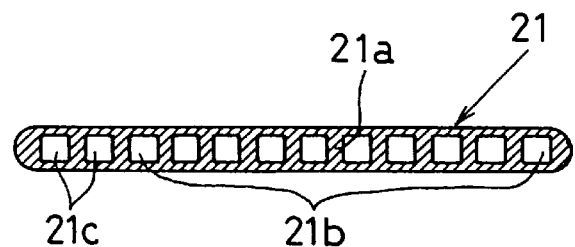
FIG. 27 is a cross sectional view showing a connecting member according to the fifteenth embodiment.

The connecting member 21 is a thin extruded member (of wall thickness 1 to 2 mm) made from relatively soft material such as aluminum, and as shown in FIG. 27 has inside it multiple passages 21b, 21c divided by ribs 21a. As a result of providing the ribs 21a in the connecting member 21, the merits are obtained that the strength of the connecting member 21 with respect to refrigerant pressure is increased and its heat transfer area increases so that the resistance to heat transfer between the connecting member 21 and the refrigerant is reduced.

One end of the connecting member 21 is connected to the refrigerant rank 2, while the other end is connected to the tank part 23 of the condensing vessel 20. The connecting member 21 can be flexibly bent between the both ends (see FIG. 26). The multiple passages 21b, 21c of the connecting member 21 are, as shown in FIG. 28, used as a vapor passage 21b communicating between the boiling region 2A of the refrigerant tank 2 and the first space 23A and a liquid passage 21c communicating between the liquid refrigerant inflow region 2B of the refrigerant tank 2 and the second space 23B, respectively.

This cooling apparatus 1 is manufactured by assembling the refrigerant tank 2, the condensing vessel 20 and the connecting member 21 into the overall shape and then integrally brazing this assembly.

The operation of this fifteenth embodiment will be described.

Refrigerant boiled and vaporized by heat from the heat-emitting body 3 flows from the boiling region 2A of the refrigerant tank 2, through the vapor passages 21b of the connecting member 21, and into the first space 23A of the tank part 23. The refrigerant flows from this first space 23A through the connecting opening 23a into the first header 5A, and from the header 5A into the refrigerant tubes 4. The vapor refrigerant flowing into the refrigerant tubes 4 condenses on the inner walls of the refrigerant tubes 4 and forms liquid droplets, and these are pushed by the flow of the vapor refrigerant and flow through the refrigerant tubes 4 towards the second header 5B. The liquid refrigerant having flowed into the second header 5B flows from the second header 5B through the other connecting opening 23b of the tank part 23 into the second space 23B of the tank part 23. And then, the liquid refrigerant flows through the liquid passages 21c of the connecting member 21 into the liquid refrigerant inflow region 2B of the refrigerant tank 2. Thereafter, the refrigerant circulates from the liquid refrigerant inflow region 2B through the flow aperture 22 back to the boiling region 2A and repeats the cycle described above (boiling-condensing-liquefaction).

Heat transmitted from the heat-emitting body 3 is released as latent heat of condensation as the vapor refrigerant condenses inside the refrigerant tubes 4 and is emitted from the walls of the refrigerant tubes 4 through the fins 8 into the atmosphere.

In this fifteenth embodiment, by connecting the refrigerant tank 2 and the condensing vessel 20 by the connecting member 21, it is possible for the condensing vessel 20 to be disposed in a position away from the refrigerant tank 2. Thus, when the heat-emitting body 3 is installed in a small space, just the refrigerant tank 2 can be disposed in the small space and the condensing vessel 20 can be disposed in a larger space. Further, because the connecting member 21 has flexibility and can be bent, it is also possible for the attitude of the condensing vessel 20 to be changed according to the direction from which it is ventilated.

By using an extruded member as the connecting member 21, as shown in FIG. 27, it is possible to simply form the multiple passages 21b, 21c inside the connecting member 21. In this case, it is possible to raise the resistance of the connecting member 21 to refrigerant pressure.

(Sixteenth Embodiment)

Figure 29:
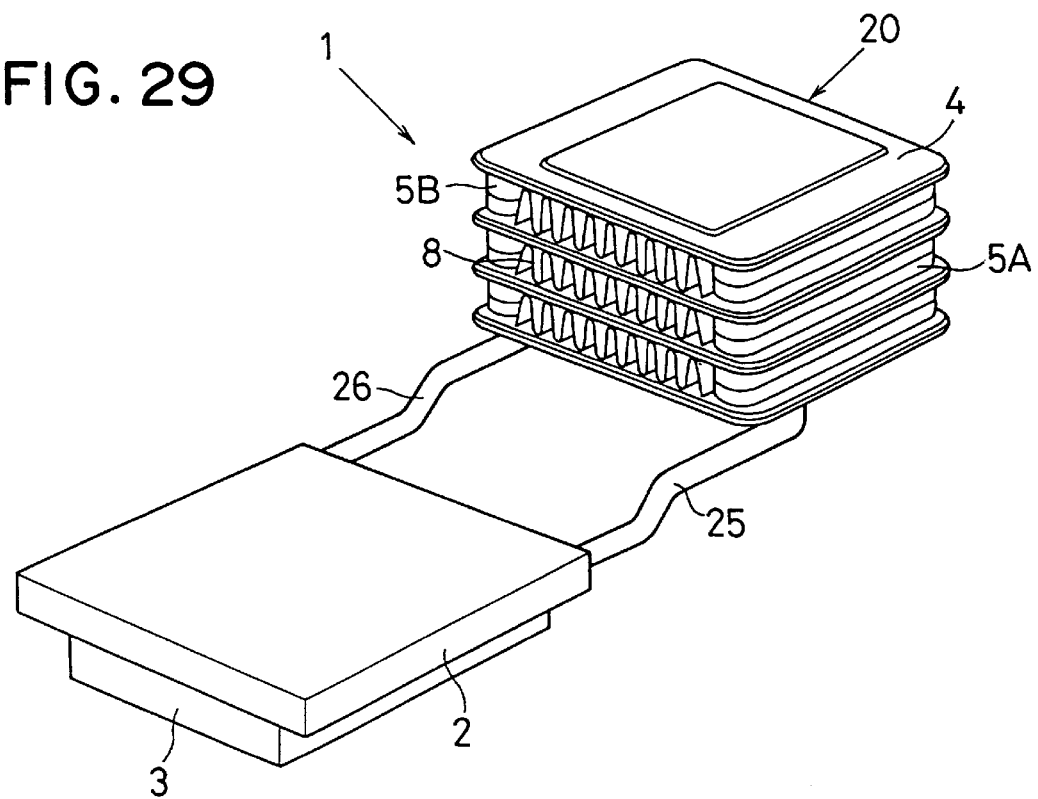
FIG. 29 is a perspective view showing a cooling apparatus according to a sixteenth embodiment.

FIG. 29 is a perspective view showing a cooling apparatus 1 according to a sixteenth embodiment.

In the sixteenth embodiment, the connecting member 21 consists of two tubes 25, 26 (the cylindrical pipes referred to in the present invention), and the tubes 25, 26 are both made from for example aluminum pipe and are flexible so that they can be bent.

Figure 30:
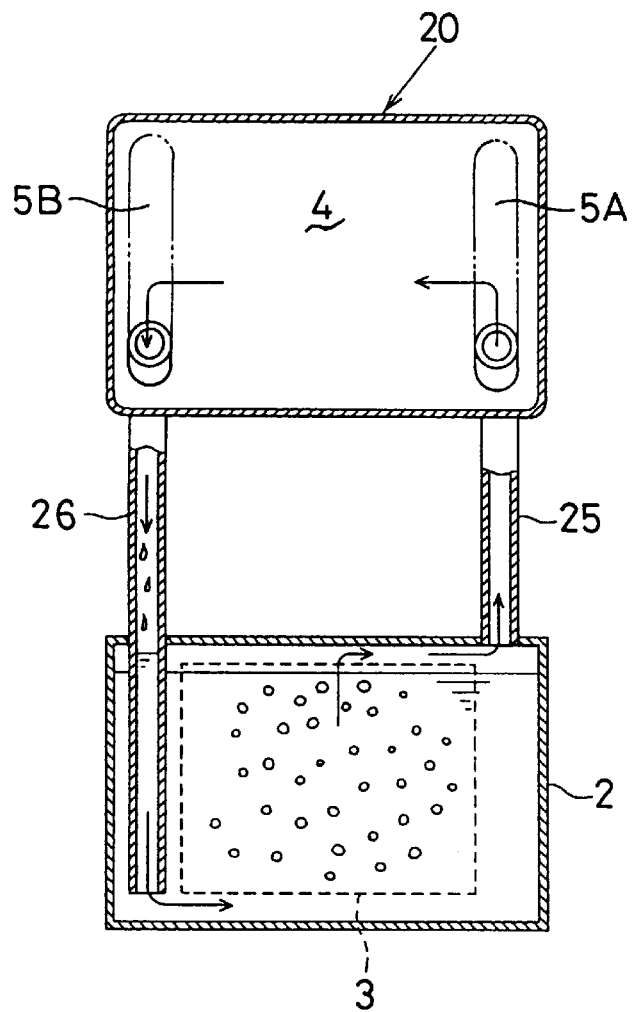
FIG. 30 is a cross sectional view showing a cooling apparatus according to a sixteenth embodiment.

The tube 25 forms a vapor refrigerant passage for guiding the vapor refrigerant from the refrigerant tank 2 to the condensing vessel 20. The tube 25 has one end connected to a round hole formed in the upper side wall of the refrigerant tank 2 and opening at the inside of the refrigerant tank 2, and the other end connected to the refrigerant tubes 4 of the condensing vessel 20 and opening at the inside of the first header 5A (see FIG. 30).

The other tube 26 forms a liquid refrigerant passage for guiding the liquid refrigerant from the condensing vessel 20 to the refrigerant tank 2. The tube 26 has one end passing through a round hole formed in the upper side wall of the refrigerant tank 2 and opening at the bottom of the inside of the refrigerant tank 2, and the other end connected to the refrigerant tubes 4 of the condensing vessel 20 and opening at the inside of the second header 5B (see FIG. 30).

The condensing vessel 20 does not have the tank part 23 shown in the fifteenth embodiment, and is made up of the refrigerant tubes 4 (including the headers 5) and the fins 8.

With this sixteenth embodiment, because one end of the tube 25 opens at the upper end of the refrigerant tank 2 and one end of the tube 26 opens at the bottom of the inside of the refrigerant tank 2, the vapor refrigerant boiled by heat from the heat-emitting body 3 must pass through the tube 25 into the condensing vessel 20 and the liquid refrigerant cooled and liquefied in the condensing vessel 20 can return to the refrigerant tank 2 through the other tube 26. By this means it is possible to form a good circulatory flow of refrigerant without interfering the vapor refrigerant and the liquid refrigerant. Further, as in the case of the fifteenth embodiment, because it is possible for the condensing vessel 20 to be installed in a position away from the refrigerant tank 2, when the heat-emitting body 3 is installed in a small space, just the refrigerant tank 2 can be disposed in the small space and the condensing vessel 20 can be disposed in a larger space. Also, because the tubes 25, 26 are flexible and can be bent, it is also possible for the attitude of the condensing vessel 20 to be changed according to the direction from which a draft is passed over it.

In the case of this sixteenth embodiment, the pipe diameters of the tubes 25, 26 may be made different. For example, the tube 25 through which the vapor refrigerant flows may be made thick and the tube 26 through which the liquid refrigerant flows may be made thin.

(Seventeenth Embodiment)

Figure 31:
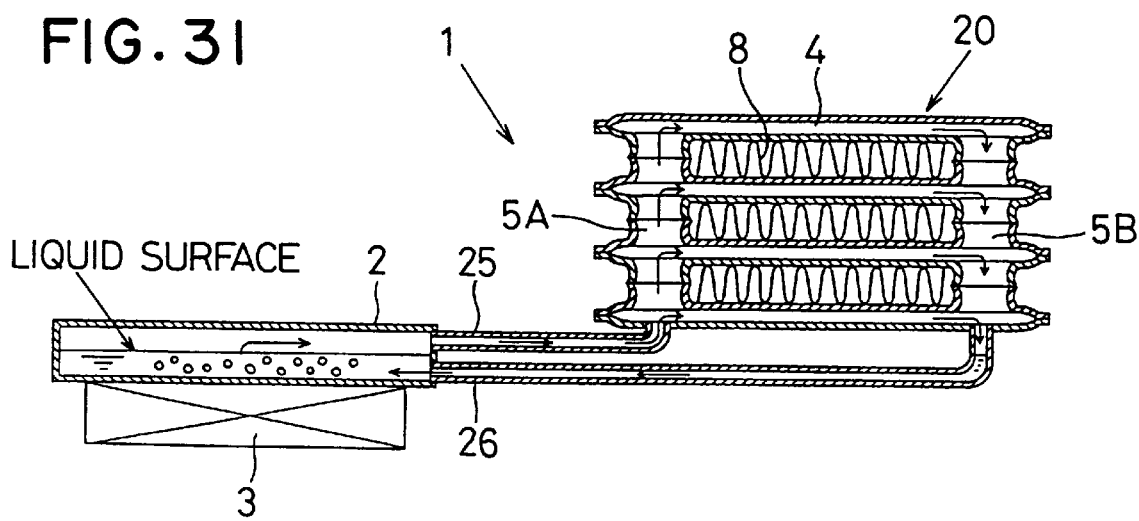
FIG. 31 is a cross sectional view showing a cooling apparatus according to a seventeenth embodiment.

FIG. 31 is a cross sectional view showing a cooling apparatus 1 according to a seventeenth embodiment.

In the seventeenth embodiment, a case wherein the cooling apparatus 1 is used installed substantially horizontally will be described.

In the construction of the cooling apparatus, as in the sixteenth embodiment described above, a refrigerant tank 2 and a condensing vessel 20 are connected by two tubes 25, 26. Here, the tube 25 forming the vapor refrigerant passage is connected to the refrigerant tank 2 in a higher position than the tube 26 forming the liquid refrigerant passage. Specifically, as shown in FIG. 31, the tube 25 is connected to the refrigerant tank 2 above the refrigerant liquid surface inside the refrigerant tank 2, and the tube 26 is connected to the refrigerant tank 2 below the refrigerant liquid surface. As a result, the vapor refrigerant boiled inside the refrigerant tank 2 passes through the tube 25 to the condensing vessel 20, and the liquid refrigerant cooled and liquefied in the condensing vessel 20 returns to the refrigerant tank 2 through the tube 26.

(Eighteenth Embodiment)

Figure 32:
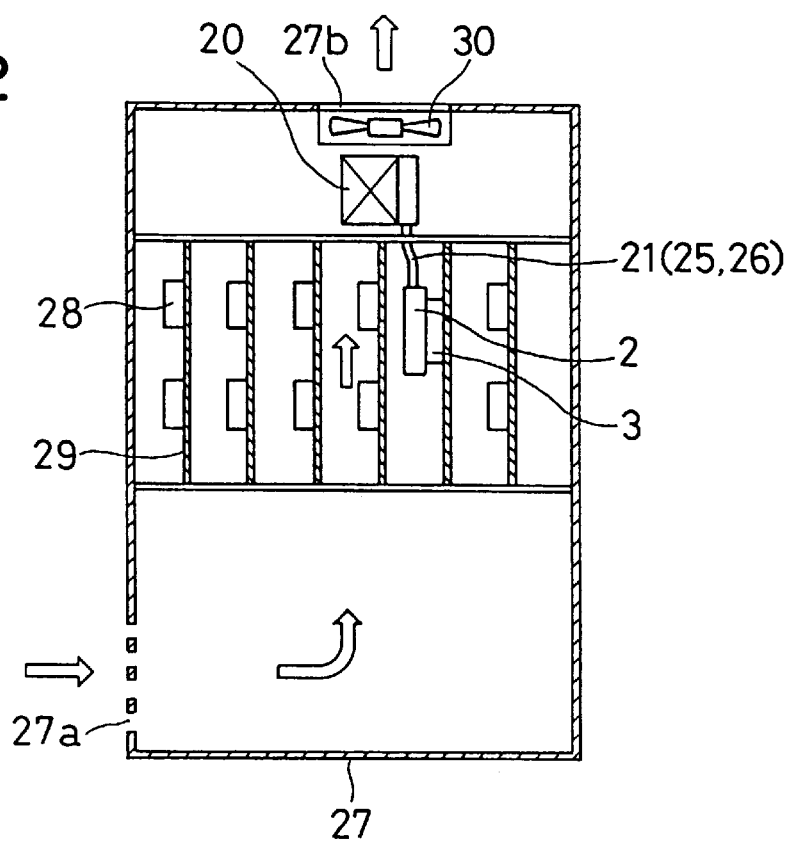
FIG. 32 is a cross sectional view showing an example of usage of a cooling apparatus according to an eighteenth embodiment.

FIG. 32 is a cross sectional view showing an example of usage of a cooling apparatus 1 according to an eighteenth embodiment.

The eighteenth embodiment shows an example of a case wherein a heat-emitting body 3 (for example a CPU) housed inside a casing 27 of a computer is cooled by means of the cooling apparatus 1.

As shown in FIG. 32, numerous boards 29 on which semiconductor devices 28 are mounted are disposed vertically with a narrow spacing inside the casing 27, and a heat-emitting body 3 requiring cooling is mounted on one of these boards 29.

A refrigerant tank 2 of the cooling apparatus 1 to which is fixed the heat-emitting body 3 is disposed in a narrow space between two boards 29, and a condensing vessel 20 connected to this refrigerant tank 2 by a connecting member 21 is installed in a relatively open space inside the casing 27.

A cooling fan 30 is mounted on the ceiling face of the casing 27 in the proximity of the condensing vessel 20. By rotating this cooling fan 30, cool air is sucked in through an intake opening 27a provided in a bottom part of the casing 27 and made to cool the condensing vessel 20 before being exhausted to outside through an exhaust opening 27b.

When, as in this eighteenth embodiment, it is necessary to cool a heat-emitting body 3 in a confined space, it is sometimes impossible to accommodate the whole of a cooling apparatus 1 in the confined space. Even in such cases, the cooling apparatus 1 according to the eighteenth embodiment can be used effectively in the manner described above.

(Nineteenth Embodiment)

Figure 33:
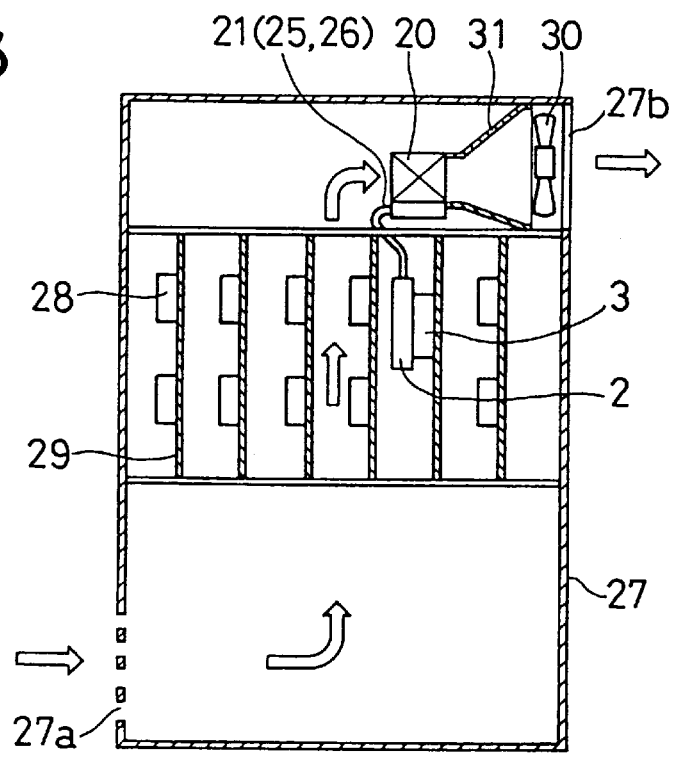
FIG. 33 is a cross sectional view showing an example of usage of a cooling apparatus according to a nineteenth embodiment.

FIG. 33 is a cross sectional view showing an example of usage of a cooling apparatus 1 according to a nineteenth embodiment.

The nineteenth embodiment shows an example of a case wherein the cooling apparatus 1 is used inside a casing 27 of a computer, as in the eighteenth embodiment. However, in this nineteenth embodiment, the attitude of the condensing vessel 20 has been changed to suit a different mounting position of the cooling fan 30. That is, whereas in the eighteenth preferred embodiment, the cooling fan 30 was mounted on the ceiling face of the casing 27, in the present preferred embodiment, the cooling fan 30 is mounted on a side wall face of the casing 27. In this kind of case, when the attitude of the condensing vessel 20 cannot be changed with respect to the refrigerant tank 2, the heat-radiating performance thereof is impaired because a sufficient flow of cooling air cannot be supplied to the condensing vessel 20. On the other hand, with the cooling apparatus 1 according to the nineteenth embodiment described above, because it is possible to change the attitude of the condensing vessel 20 easily by bending the flexible connecting member 21 (or tubes 25, 26) connecting the refrigerant tank 2 with the condensing vessel 20, it is possible to secure the required heat-radiating performance.

In cases such as when the gap between the cooling fan 30 and the condensing vessel 20 is large, a duct 31 may be provided between the cooling fan 30 and the condensing vessel 20. By this means it is possible to guide a cooling draft to the condensing vessel 20 efficiently.

(Twentieth Embodiment)

Figure 34:
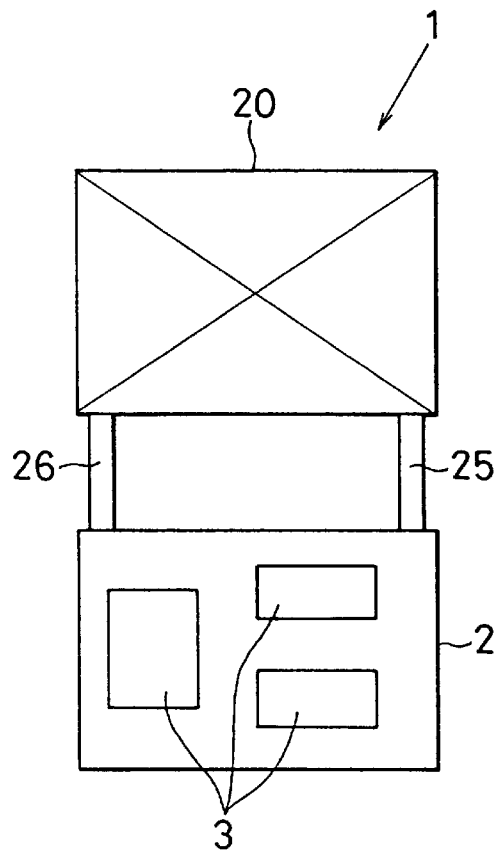
FIG. 34 is a front view showing a cooling apparatus according to a twentieth embodiment.

FIG. 34 is a front view showing a cooling apparatus 1 according to a twentieth embodiment.

The twentieth embodiment shows an example of a case wherein a plurality of heat-emitting bodies 3 (three in FIG.

34) are mounted on a single refrigerant tank 2. When the amount of heat produced by each heat-emitting body 3 is small, a plurality of heat-emitting bodies 3 can be cooled by being mounted on the single refrigerant tank 2 in this way.

(Twenty-first Embodiment)

Figure 35:
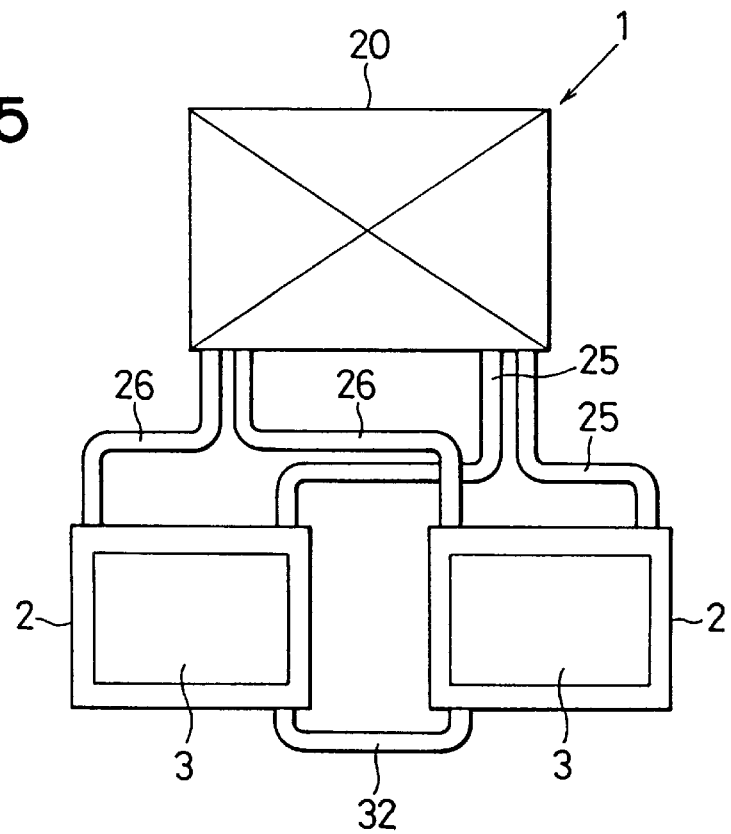
FIG. 35 is a front view showing a cooling apparatus according to twenty-first embodiment.

FIG. 35 is a front view showing a cooling apparatus 1 according to a twenty-first embodiment.

The twenty-first embodiment shows an example of a case wherein a plurality of refrigerant tanks 2 are connected by tubes 25, 26 to a single condensing vessel 20. For example, when a plurality of heat-emitting bodies 3 are disposed away from each other, because it is not possible for all the heat-emitting bodies 3 to be mounted on the single refrigerant tank 2, the refrigerant tank 2 can be provided for each of the heat-emitting bodies 3 and just the condensing vessel 20 used commonly, as shown in FIG. 35. Because the tubes 25, 26 can be bent, this kind of case can also be handled easily.

In this case, to make the refrigerant liquid surface levels the same in all the refrigerant tanks 2, the bottom sides of the refrigerant tanks 2 are preferably connected with a connecting pipe 32 or the like.

(Twenty-second Embodiment)

Figure 36:
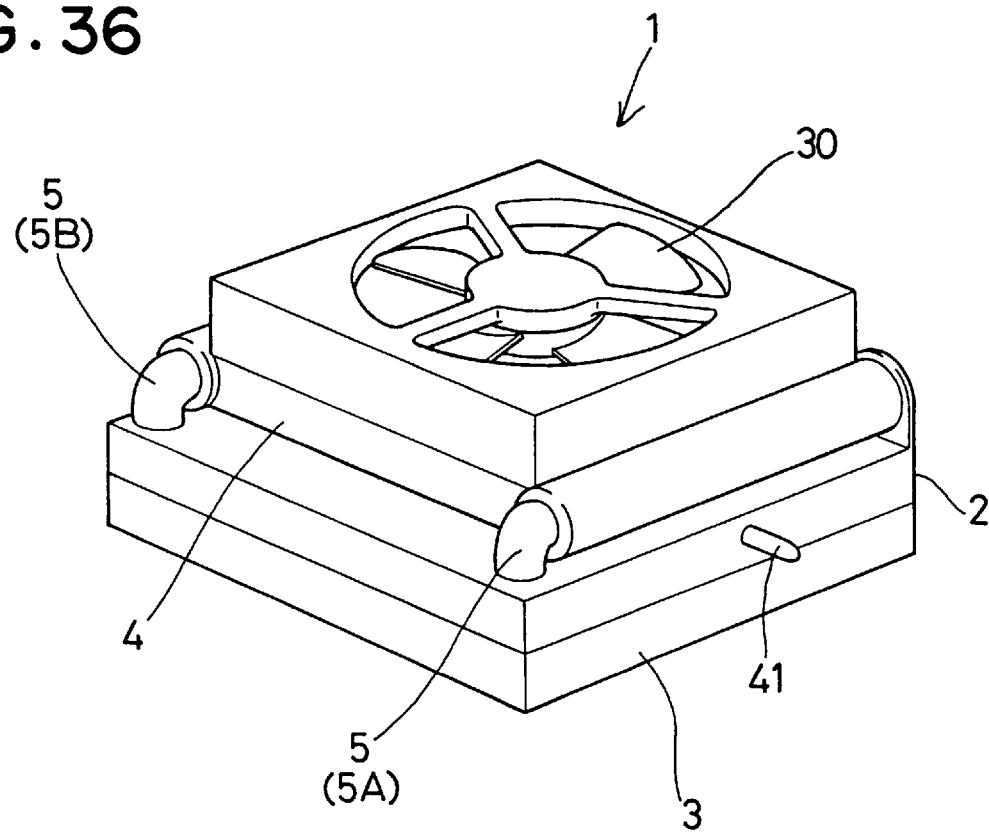
FIG. 36 is a perspective view showing a cooling apparatus according to a twenty-second embodiment.

FIG. 36 is a perspective view showing a cooling apparatus 1 according to a twenty-second embodiment.

The cooling apparatus 1 of this twenty-second embodiment cools a heat-emitting body 3 by means of the boiling and condensing action of a refrigerant, and is made up of a refrigerant tank 2 containing a liquid refrigerant, a condensing vessel 20 constructed by stacking refrigerant tubes 4 and radiating fins 8 alternately in a plurality of stages (see FIG. 37), two headers 5 (first header 5A and second header 5B) connecting the refrigerant tank 2 and the refrigerant tubes 4, and a cooling fan 30 for blowing air through the condensing vessel 20.

The refrigerant tank 2 is made in the shape of a flat box of metal material (for example aluminum) having good thermal conductivity. The bottom surface of the refrigerant tank 2 has flatness to serve as a mounting face for the heat-emitting body 3.

The condensing vessel 20 is held by the two headers 5 and mounted on the top of the refrigerant tank 2. A core face of the condensing vessel 20 (a face through which cooling air passes) is disposed substantially parallel with the refrigerant tank 2, and a predetermined gap S (see FIG. 40) is provided between this and the refrigerant tank 2.

Figure 37:
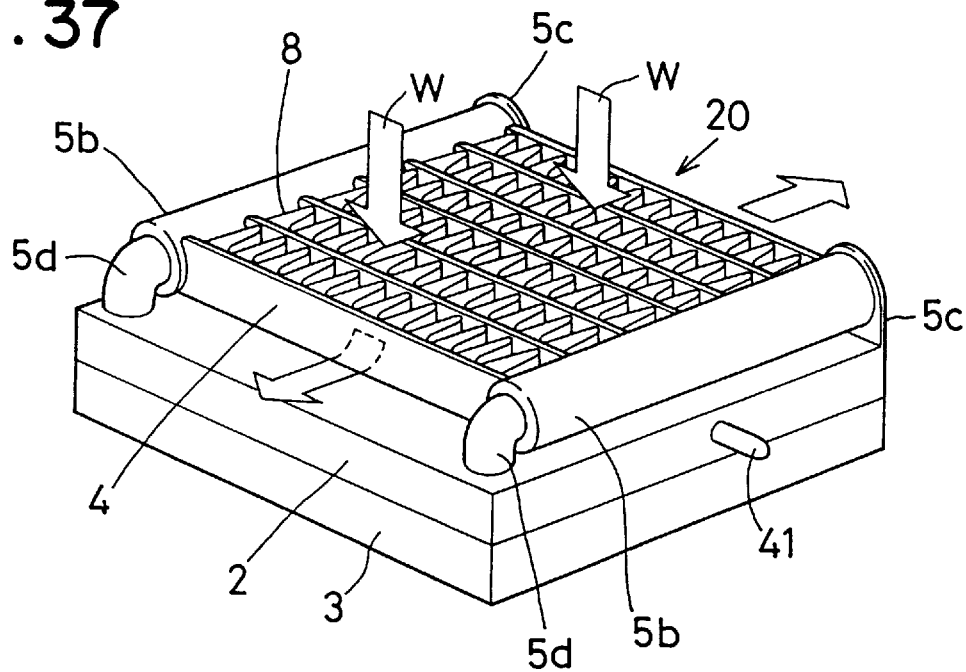
FIG. 37 is a perspective view showing the cooling apparatus unit with a cooling fan removed.
Figure 38:
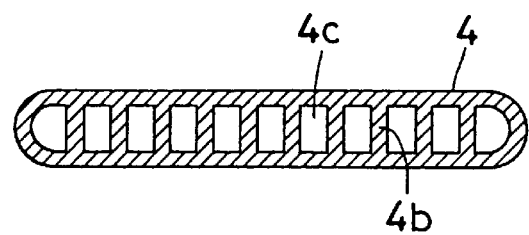
FIG. 38 is a cross sectional view showing a refrigerant tube according to the twenty-second embodiment.
Figure 39:
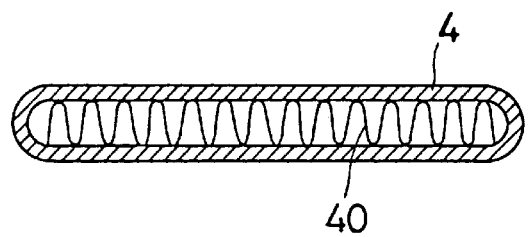
FIG. 39 is a cross sectional view showing another refrigerant tube according to the twenty-second embodiment.

The refrigerant tubes 4 are for example extruded aluminum tubes and are formed in a flat hollow shape. As shown in FIG. 37, the refrigerant tubes 4 are arrayed with a predetermined mutual spacing in an attitude such that the tube wall faces are perpendicular to the refrigerant tank 2. Inside the refrigerant tubes 4, as shown in FIG. 38, a plurality of passages 4c divided by ribs 4b are provided. In this case, providing the ribs 4b has the effect that the strength of the refrigerant tubes 4 with respect to refrigerant pressure is increased and the area for condensation increases. Instead of providing the ribs 4b, the same effect can be obtained by inserting an inner fin 40 into the refrigerant tubes 4.

The fins 8 are made by corrugating into a wavy shape a thin sheet of metal such as aluminum, and are interposed between the adjacent refrigerant tubes 4 and joined to the wall faces of the refrigerant tubes 4.

The headers 5 consist of a first header 5A attached to one side of the condensing vessel 20 and a second header 5B attached to the other side of the condensing vessel 20.

As shown in FIG. 37, the headers 5A, 5B are each made up of a cylindrical pipe 5b connected to open ends of the refrigerant tubes 4, a plate 5c covering one open end of this cylindrical pipe 5b, and a joint pipe 5d connected to the other open end of the cylindrical pipe 5b. This joint pipe 5d is connected to the refrigerant tank 2 and communicates with the inside of the refrigerant tank 2 (see FIG. 40). The joint pipes 5d and the plates 5c of the headers 5 are fixed to the upper face of the refrigerant tank 2. The cylindrical pipes 5b are supported clear of the refrigerant tank 2 by these joint pipes 5d and plates 5c, whereby the whole of the condenser is held above the refrigerant tank 2 by the cylindrical pipes 5b.

The cooling fan 30 is mounted above the condensing vessel 20, as shown in FIG. 36, and is an axial flow fan which blows air sucked in from above it at the core face of the condensing vessel 20. Cooling air having passed through the core face of the condensing vessel 20, as shown with arrows in FIG. 37, strikes the upper face of the refrigerant tank 2 and changes direction and flows outward in four directions through the gap S provided between the refrigerant tank 2 and the condensing vessel 20.

The heat-emitting body 3 is provided in a thin plate shape of for example 70 mm×70 mm×5 mm (thickness). This heat-emitting body 3 is mounted on a central part of the bottom face of the refrigerant tank 2 with a heat-conducting member (for example thermal grease or sheet-form glass foil) therebetween, and is fixed by means such as screws or clips.

The refrigerant is filled into the refrigerant tank 2 through a filling pipe 41 attached to a side face of the refrigerant tank 2. The refrigerant is filled to position lower than the upper face of the refrigerant tank 2 at a level such that a space remains above the refrigerant liquid surface (see FIG. 40).

This cooling apparatus 1 is manufactured by assembling together the refrigerant tank 2, the condensing vessel 20 (the refrigerant tubes 4 and the radiating fins 8), the headers 5 and the cooling fan 30 and then integrally brazing the assembly.

Figure 40:
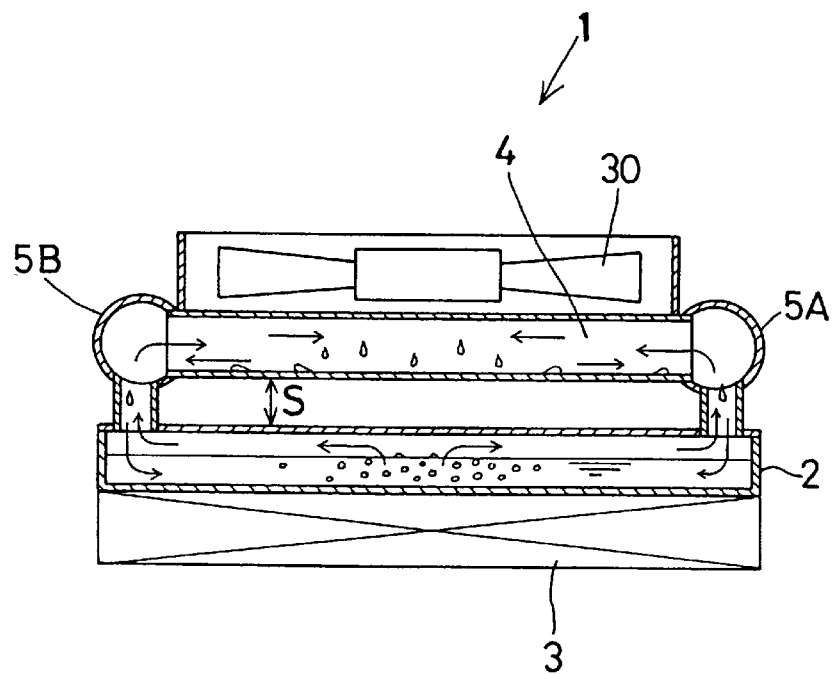
FIG. 40 is a cross sectional view showing the cooling apparatus installed horizontally.

Next, the operation of the twenty-second embodiment will be described.

a) When the cooling apparatus 1 is installed horizontally, as shown in FIG. 40:

The refrigerant boiled and vaporized in the refrigerant tank 2 by heat from the heat-emitting body 3 flows through the space above the liquid surface into the headers 5A, 5B, and from both of the headers 5A, 5B into the refrigerant tubes 4. The vapor refrigerant flowing through the refrigerant tubes 4 condenses on the inner walls of the refrigerant tubes 4 over which air is being blown by the cooling fan 30 and forms droplets, and these are pushed by the flow of the vapor refrigerant and move through the refrigerant tubes 4 and flow into both of the headers 5A, 5B, and circulate from the headers 5A, 5B back to the inside of the refrigerant tank 2, whereupon this cycle (boiling-condensing-liquefaction) is repeated again.

Figure 41:
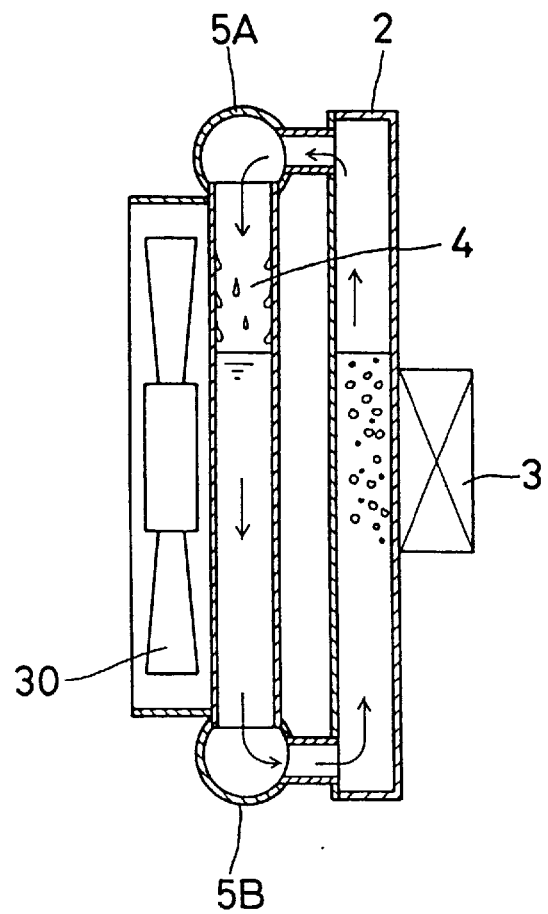
FIG. 41 is a cross sectional view showing the cooling apparatus installed vertically.

Meanwhile, heat transmitted from the heat-emitting body 3 is released as latent heat of condensation as the vapor refrigerant condenses inside the refrigerant tubes 4 and is emitted from the refrigerant tubes 4 through the radiating fins 8 into the cooling draft.

b) When the cooling apparatus 1 is installed vertically, as shown in FIG. 41:

In this case, the cooling apparatus 1 is used stood up so that the refrigerant tubes 4 are substantially vertical. Thus, the first header 5A (or the second header 5B) is positioned above the condensing vessel 20 and the second header 5B (or the first header 5A) is positioned below the condensing vessel 20. The amount of the refrigerant sealed in the cooling apparatus 1 is such that the liquid surface covers the area where the heat-emitting body 3 is mounted.

The refrigerant boiled and vaporized by heat from the heat-emitting body 3 flows through the upper space inside the refrigerant tank 2 into the first header 5A, and from this first header 5A into the refrigerant tubes 4. The vapor refrigerant flowing through the refrigerant tubes 4 condenses on the inner walls of the refrigerant tubes 4 over which air is being blown by the cooling fan 30 and forms droplets, and these move downward along the inner walls of the refrigerant tubes 4 and return to the liquid refrigerant. The liquid refrigerant inside the refrigerant tubes 4 is supplied to the inside of the refrigerant tank 2 through the second header 5B and repeats the cycle described above (boiling-condensing-liquefaction) again.

Heat transmitted from the heat-emitting body 3 is released as latent heat of condensation as the vapor refrigerant condenses inside the refrigerant tubes 4 and is emitted from the refrigerant tubes 4 through the radiating fins 8 into the cooling draft.

According to this twenty-second embodiment, the refrigerant tank 2 and the condensing vessel 20 are disposed substantially in parallel and a gap S (see FIG. 40) is provided between the refrigerant tank 2 and the condensing vessel 20 so that air can be blown over the condensing vessel 20. By this means, compared to the cooling apparatus in the related art wherein the refrigerant tank and the condenser are attached substantially perpendicularly, the overall height of the cooling apparatus 1 can be kept low and consequently it can be used in a smaller space.

Also, by using an axial flow type cooling fan 30, because even with a small space it is not necessary for the cooling fan 30 to be mounted away from the condensing vessel 20 and the cooling fan 30 can be provided integrally with the condensing vessel 20 as shown in FIG. 36, the cooling effect thereof can be increased.

(Twenty-third Embodiment)

Figure 42:
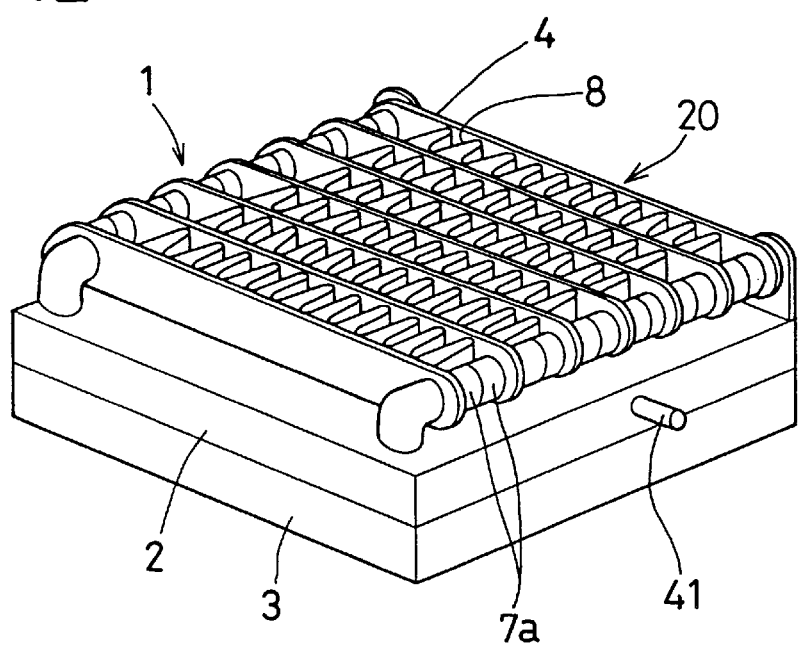
FIG. 42 is a perspective view showing a cooling apparatus with a cooling fan removed according to a twenty-third embodiment.

FIG. 42 is a perspective view showing a cooling apparatus with a cooling fan 30 removed according to a twenty-third embodiment.

In the twenty-third embodiment, the constructions of the condensing vessel 20 and the headers 5 are different from in the case of the twenty-second embodiment in that they are constructed by a plurality of press-formed core plates 7 being stacked together with radiating fins 8.

Figure 43:
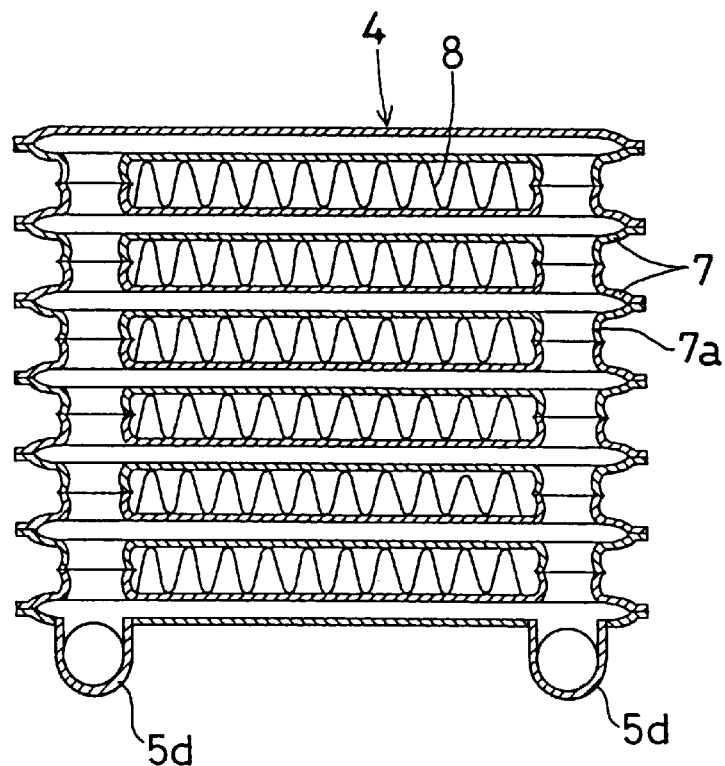
FIG. 43 is a cross sectional view showing a condensing vessel.

The refrigerant tubes 4 are each formed by two core plates 7 being joined at their edges, as shown in FIG. 43 (a cross sectional view of the condensing vessel 20).

The headers 5 have cylindrical connecting parts (equivalent to the cylindrical pipes 5b described in the twenty-second embodiment) made by tubular orifice parts 7a provided at the ends of each of the core plates 7 being brought face to face in the stacking direction, and are made up of these connecting parts and joint pipes 5d. When this kind of stacked-type core is used, assembly from one side becomes possible, and because the brazeability improves the airtightness of the condenser increases.

Figure 44:
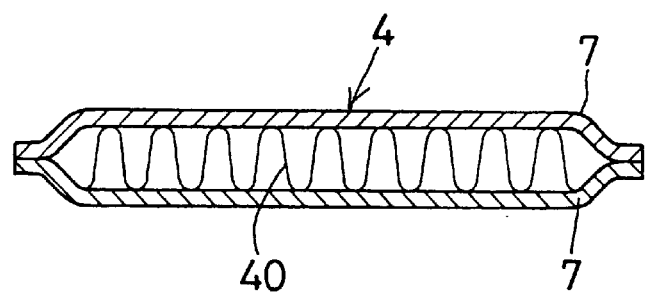
FIG. 44 is a cross sectional view showing a refrigerant tube.
Figure 45:
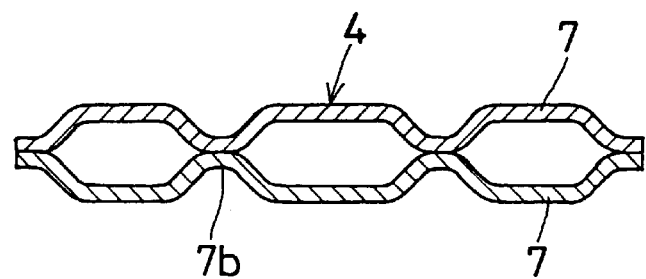
FIG. 45 is a cross sectional view showing a refrigerant tube.

Also, as in the case of the twenty-second embodiment described above, by inner fins 40 (see FIG. 44) being inserted into the insides of the refrigerant tubes 4, strength with respect to refrigerant pressure can be provided and the condensing area can be increased. Or, by providing ribs 7b sunk to the refrigerant tube 4 side in each of the two core plates 7 and joining corresponding ribs 7b together, it is possible to obtain the same effects without using inner fins 40.

(Twenty-fourth Embodiment)

Figure 46:
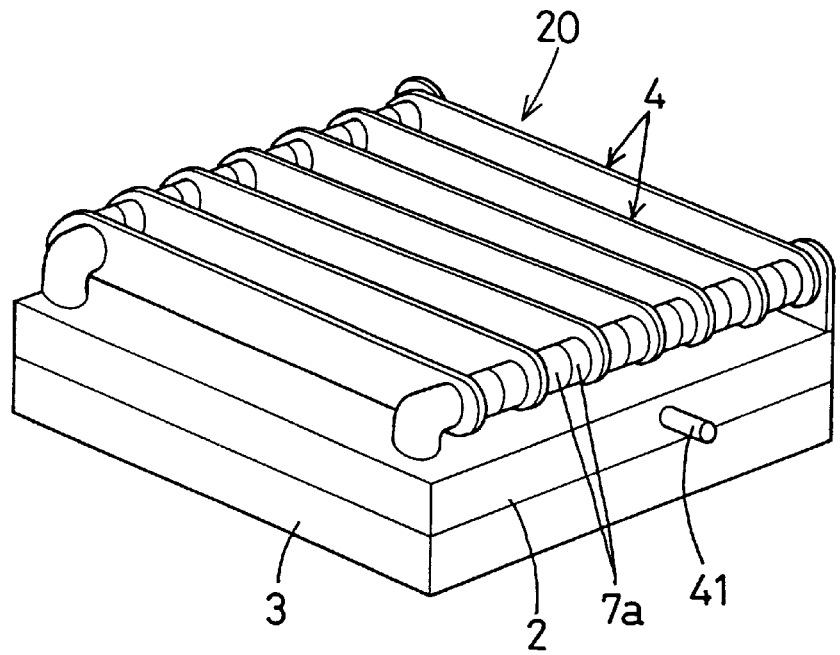
FIG. 46 is a perspective view showing a cooling apparatus with a cooling fan removed according to a twenty-fourth embodiment.

FIG. 46 is a perspective view showing a cooling apparatus 1 with a cooling fan 30 removed according to a twenty-fourth.

The twenty-fourth embodiment shows an example wherein the condensing vessel 20 is constructed using refrigerant tubes 4 only. That is, when the amount of heat produced by the heat-emitting body 3 is relatively small, because the radiating area need not to be so large, the necessary cooling capacity can be provided without using fins 8.

Also, when wavy fins 8 (corrugated fins) are provided, because the fins 8 constitute a resistance to air flow and increase pressure loss and the cooling air speed decreases, when the cooling fan 30 is installed in a location away from the condensing vessel 20, it is necessary to provide a duct (not shown) for guiding the cooling air flow from the cooling fan 30 to the condensing vessel 20. However, if the fins 8 are dispensed with and the condensing vessel 20 is constructed using only refrigerant tubes 4, because there is no resistance to air flow due to the fins 8 and pressure loss is small, an ample cooling air flow can be supplied to the condensing vessel 20 without using a duct.

Here, the condensing vessel 20 shown in FIG. 46 is constructed by stacking a plurality of the core plates 7 described in the twenty-third embodiment, however alternatively, the extruded refrigerant tubes 4 described in the twenty-second embodiment may be used.

(Twenty-fifth Embodiment)

Figure 47:
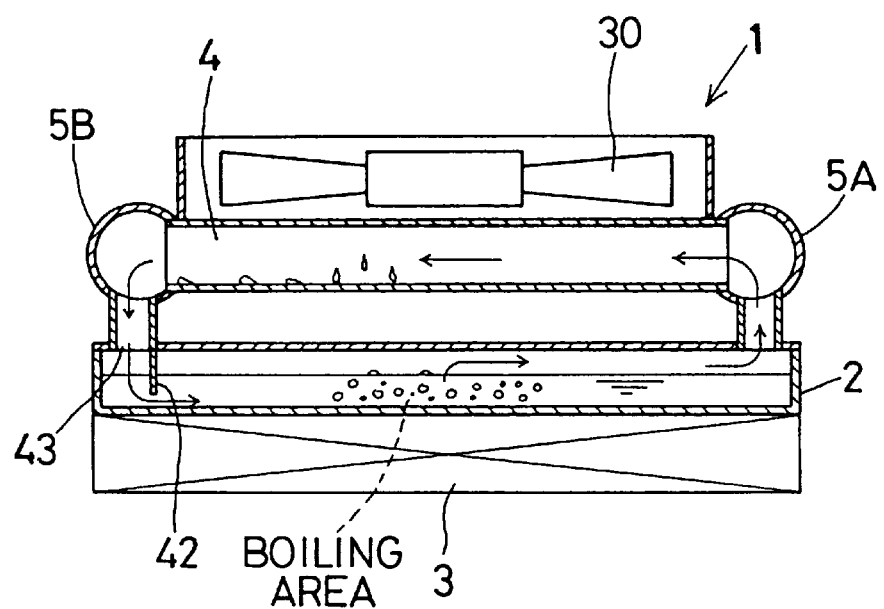
FIG. 47 is a cross sectional view showing a cooling apparatus according to a twenty-fifth embodiment.

FIG. 47 is a cross sectional view showing a cooling apparatus 1 according to a twenty-fifth embodiment.

The twenty-fifth embodiment is characterized in being provided with a refrigerant flow control plate 42 for preventing the vapor refrigerant boiled in the refrigerant tank 2 from flowing into the second header 5B.

This refrigerant flow control plate 42 cuts off a boiling area of the inside of the refrigerant tank 2 (the region where refrigerant is boiled by heat from the heat-emitting body 3 the most) from a connection opening 43 to which the second header 5B is connected.

Consequently, the vapor refrigerant boiled by heat from the heat-emitting body 3 inevitably flows to the right side of the upper space inside the refrigerant tank 2 and flows into the first header 5A, and after liquefying into a liquid refrigerant in the condensing vessel 20, returns through the second header 5B to the inside of the refrigerant tank 2 and passes under the refrigerant flow control plate 42 back to the boiling area. In this case, because the vapor refrigerant boiled in the refrigerant tank 2 and the liquid refrigerant liquefied in the condensing vessel 20 do not interfere and refrigerant can be made to circulate naturally in one direction, the cooling performance is improved.

(Twenty-sixth Embodiment)

Figure 48:
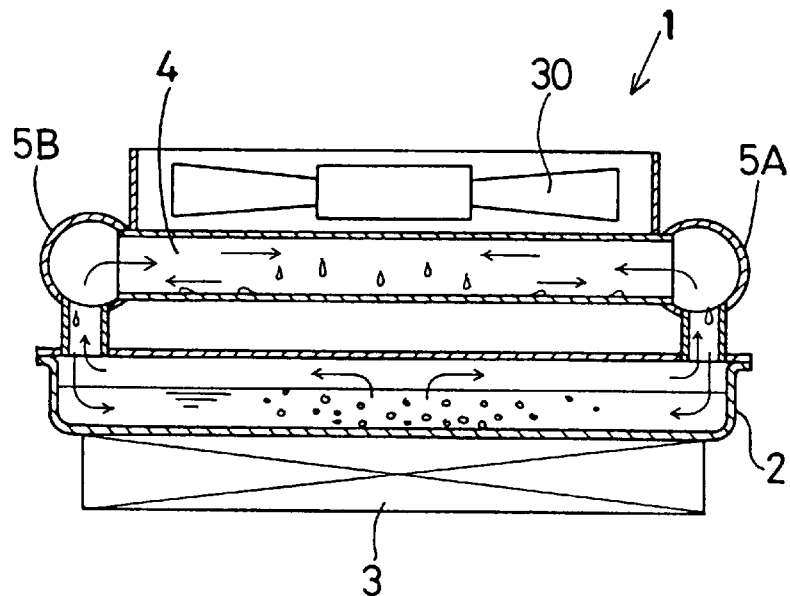
FIG. 48 is a cross sectional view showing a cooling apparatus according to a twenty-sixth embodiment.

FIG. 48 is a cross sectional view showing a cooling apparatus 1 according to a twenty-sixth embodiment.

The twenty-sixth embodiment shows an example wherein the refrigerant tank 2 is manufactured by using a press-formed component, as shown in FIG. 48. When this kind of press-formed component is used, there is the merit that manufacture is easy and the refrigerant tank 2 can be manufactured at a lower cost than when it is manufactured by cutting or the like.

(Twenty-seventh Embodiment)

Figure 49:
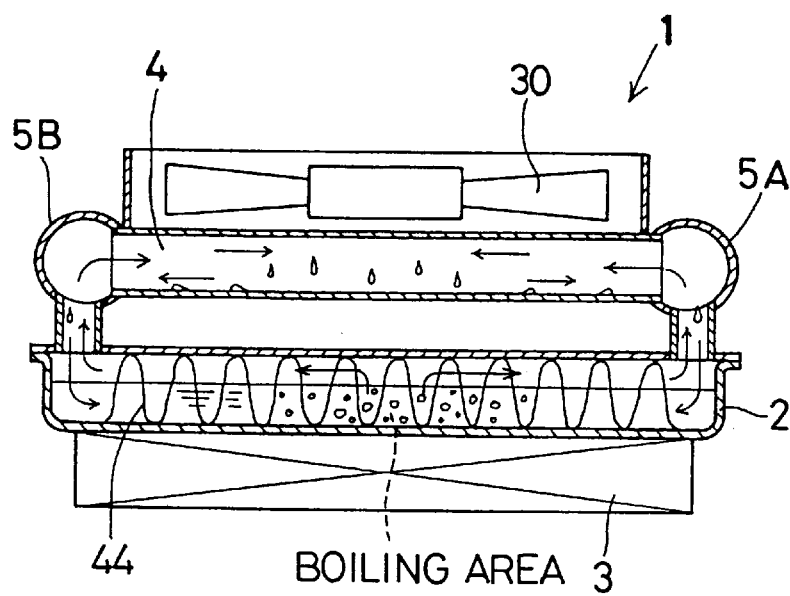
FIG. 49 is a cross sectional view showing a cooling apparatus according to a twenty-seventh embodiment.

FIG. 49 is a cross sectional view showing a cooling apparatus according to a twenty-seventh embodiment.

The twenty-seventh embodiment shows an example wherein an inner fin 44 is disposed inside the refrigerant tank 2 shown in the twenty-sixth embodiment described above. In this case, because the boiling area inside the refrigerant tank 2 is increased by providing the inner fin 44, overheating of the refrigerant is suppressed and heat-resistance of the boiling area can be reduced. Since the inner fin 44 also functions as a strengthening member of the refrigerant tank 2, strength can be secured even when the pressure inside the refrigerant tank 2 is large.

Figure 50:
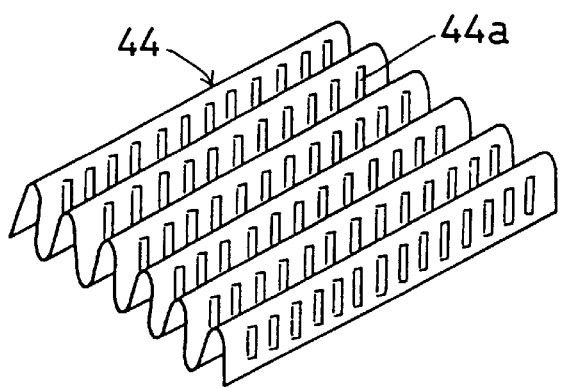
FIG. 50 is a perspective view showing an inner fin.

When a wavy inner fin 44 (corrugated fin) is used, as shown in FIG. 50, multiple slits 44a may be formed in the fin walls. When this is done, even when an inner fin 44 is provided in the refrigerant tank 2, the movement of refrigerant is not restricted by this inner fin 44 and refrigerant can move around inside the refrigerant tank 2 relatively freely through the slits 44a.

(Twenty-eighth Embodiment)

Figure 51:
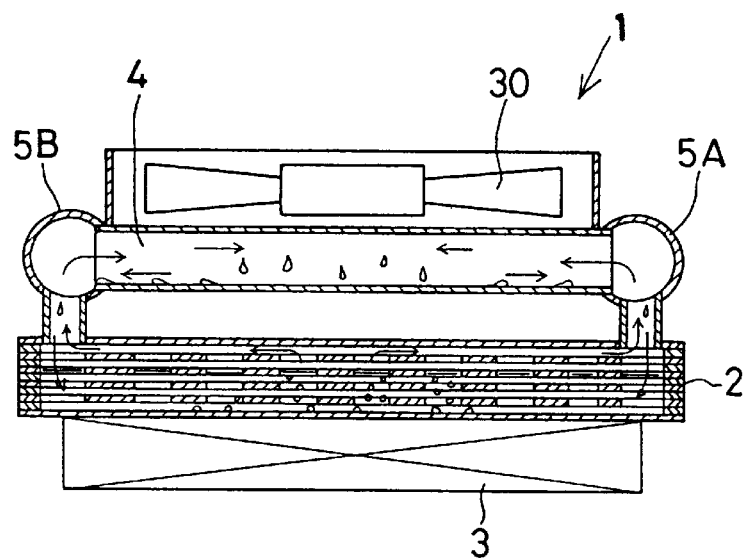
FIG. 51 is a cross sectional view showing a cooling apparatus according to a twenty-eighth embodiment.

FIG. 51 is a cross sectional view showing a cooling apparatus according to a twenty-eighth embodiment.

Figure 52:
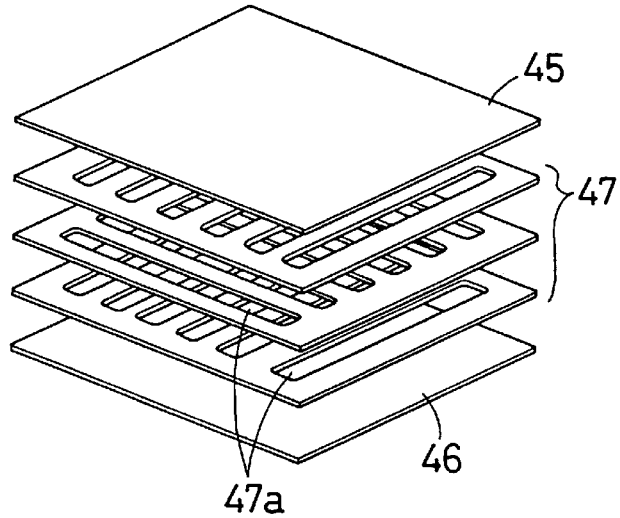
FIG. 52 is a perspective view showing a plates constituting a refrigerant tank.

The twenty-eighth embodiment shows an example wherein the refrigerant tank 2 is made a stack construction. As shown in FIG. 52, the refrigerant tank 2 consists of two flat plates 45, 46 forming the bottom face and the top face of the refrigerant tank 2 (connection openings of headers 5 being provided in the flat plate 45 forming the top face), and a plurality of lamination plates 47 sandwiched between the flat plates 45, 46. Slots 47a are formed in the lamination plates 47, and the lamination plates 47 are stacked so that the slots 47a of adjacent lamination plates 47 intersect.

In this case, the contact area between the boiling area inside the refrigerant tank 2 and the refrigerant can be enlarged, and because heat transfer can be improved, an improvement in capacity can be achieved. And, because the pillar parts of the lamination plates 47 (the parts where the slots 47a are not formed) are stacked between the flat plates 45, 46 forming the top face and the bottom face of the refrigerant tank 2, there is also the effect that the pressure-resisting strength of the refrigerant tank 2 can be increased.

(Twenty-ninth Embodiment)

Figure 53:
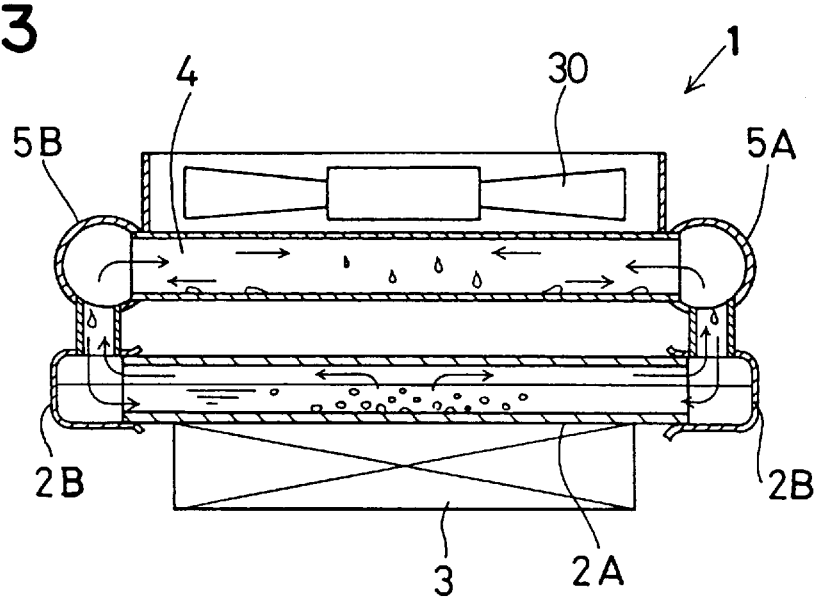
FIG. 53 is a cross sectional view showing a cooling apparatus according to a twenty-ninth embodiment.

FIG. 53 is a cross sectional view showing a cooling apparatus 1 according to a twenty-ninth embodiment.

The twenty-ninth embodiment shows an example wherein the refrigerant tank 2 is manufactured by using an extruded component.

Figure 54:
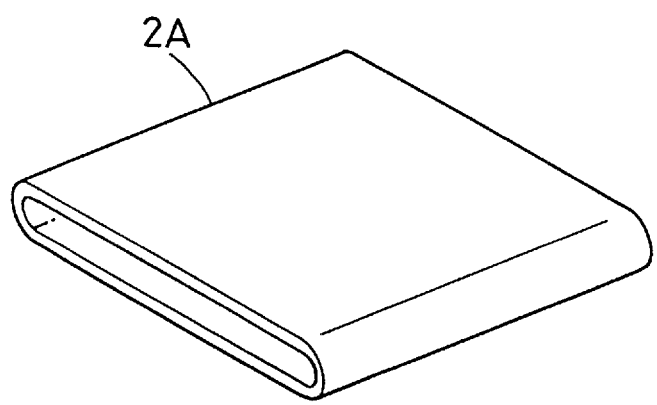
FIG. 54 is a perspective view showing an extrusion molded component used in a refrigerant tank.
Figure 55:
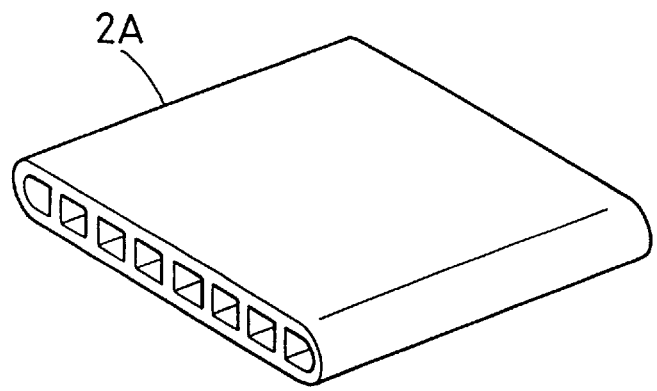
FIG. 55 is a perspective view showing an extrusion molded component used in a refrigerant tank.

As the refrigerant tank 2, an extruded component 2A of a flat pipe type as shown in FIG. 54, or an extruded component 2A of a multi-holed type as shown in FIG. 55 may be used. It is possible to increase the boiling area and provide strength with respect to the refrigerant pressure. Because both ends of the extruded component 2A are open, as the refrigerant tank 2, as shown in FIG. 53, the extruded component 2A is used with an end cap 2B fitted to either end. However, the end caps 2B are provided with spaces through which the refrigerant can move freely so that they do not merely block the ends of the extruded component 2A but rather function as connecting parts connecting the headers 5 with the extruded component 2A.

(Thirtieth Embodiment)

Figure 56:
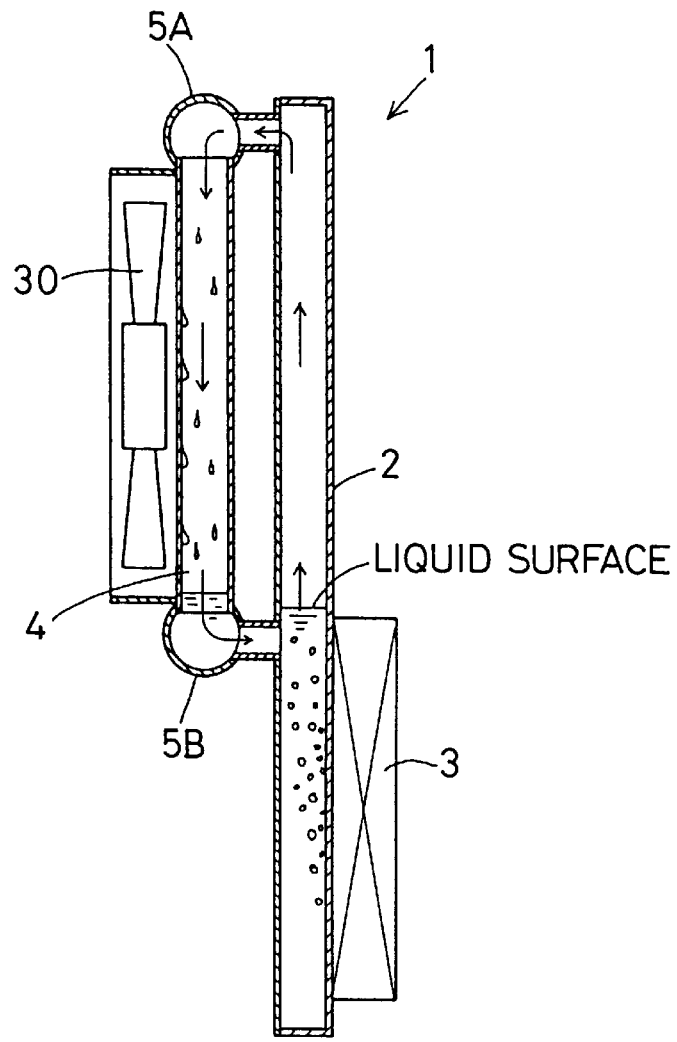
FIG. 56 is a cross sectional view showing a cooling apparatus installed vertically according a thirtieth embodiment.

FIG. 56 is a cross sectional view showing a cooling apparatus 1 according to a thirtieth embodiment.

In the thirtieth embodiment, the cooling apparatus 1 is used installed vertically, and as shown in FIG. 56, the refrigerant tank 2 extends further downward than the condensing part. In this case, by the heat-emitting body 3 being mounted on the lower side of the refrigerant tank 2, it is possible for the liquid surface to be set low with respect to the condensing vessel 20. That is, in the twenty-second embodiment, when the cooling apparatus 1 is used installed vertically, so that the liquid surface reaches a height such that it covers the heat-emitting body 3 (see FIG. 41), the refrigerant tubes 4 of the condensing vessel 20 also are filled with liquid refrigerant to the same height as the refrigerant tank 2, and the region that can be used as the condensing vessel 20 is consequently halved.

In the thirtieth embodiment, on the other hand, because the refrigerant tank 2 is extended downward below the condensing vessel 20 and the liquid surface is lowered, most of each of the refrigerant tubes 4 appears above the liquid surface. As a result, the whole of the condensing vessel 20 can be effectively used and a necessary heat-radiating performance can be secured.

(Thirty-first Embodiment)

Figure 57:
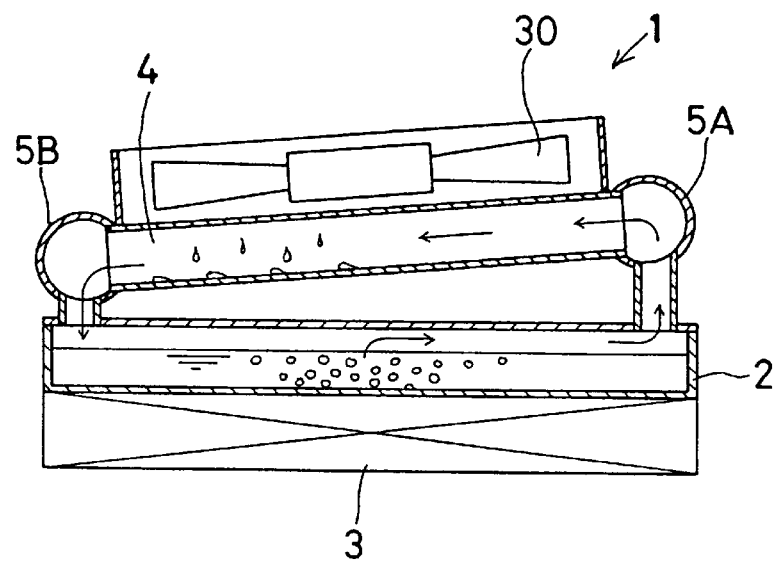
FIG. 57 is a cross sectional view showing a cooling apparatus according to a thirty-first embodiment.

FIG. 57 is a cross sectional view showing a cooling apparatus 1 according to a thirty-first embodiment.

The thirty-first embodiment shows a construction wherein the condensing vessel 20 is inclined with respect to the refrigerant tank 2.

The whole of the condensing vessel 20 is inclined with respect to the refrigerant tank 2 so that the first header 5A is higher than the second header 5B.

For example, when the condensing vessel 20 is mounted parallel to the refrigerant tank 2 and the cooling apparatus 1 is used horizontally, vapor refrigerant boiled in the refrigerant tank 2 and liquid refrigerant liquefied in the condensing vessel 20 interfere and the return of the liquid refrigerant is consequently hindered, and there is a danger of the cooling performance falling due to low-temperature liquid refrigerant collecting inside the refrigerant tubes 4.

In the thirty-first embodiment, on the other hand, by the condensing vessel 20 being inclined, the liquid refrigerant can be prevented from collecting in the refrigerant tubes 4 and the circulation of refrigerant is promoted. Consequently, there is the merit that the heat-radiating performance can be improved.

(Thirty-second Embodiment)

Figure 58:
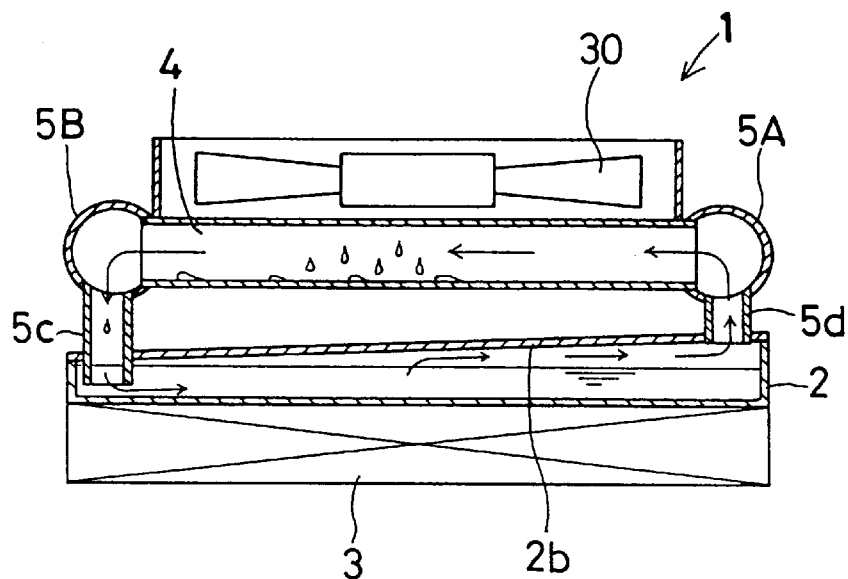
FIG. 58 is a cross sectional view showing a cooling apparatus according to a thirty-second embodiment.

FIG. 58 is a cross sectional view showing a cooling apparatus 1 according to a thirty-second embodiment.

The thirty-second embodiment shows a construction wherein the upper face 2b of the refrigerant tank 2 is inclined so that the first header 5A side thereof is high and the second header 5B side thereof is low.

In this case, vapor refrigerant boiled by heat from the heat-emitting body 3 can move easily along the inclined face (the upper face 2b) of the refrigerant tank 2. And, when the second header 5B (the joint pipe 5d) is extended into the refrigerant tank 2 so that it opens below the liquid surface, the vapor refrigerant is forced to flow along the inclined face (the upper face 2b) into the first header 5A and the liquid refrigerant returns to the inside of the refrigerant tank 2 through the second header 5B, and because the refrigerant is thus made to circulate naturally in one direction the cooling performance can be improved.

(Thirty-third Embodiment)

Figure 59:
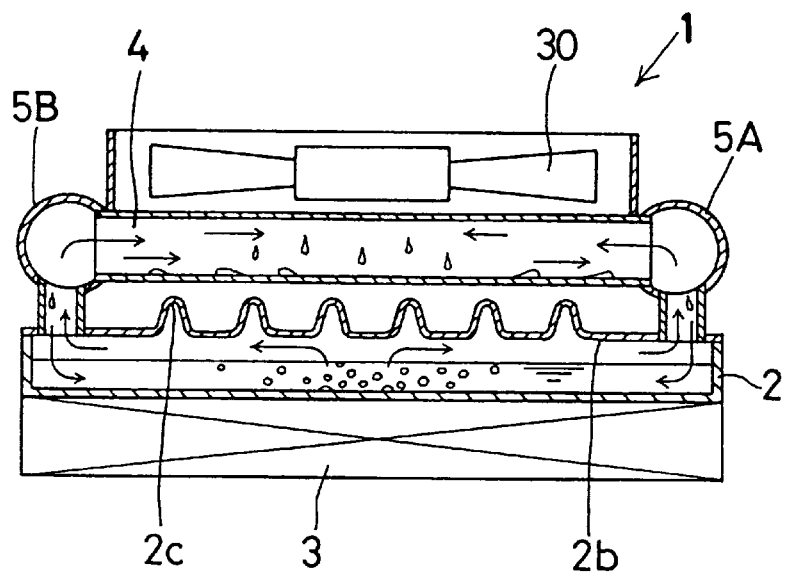
FIG. 59 is a cross sectional view showing a cooling apparatus according to a thirty-third embodiment.

FIG. 59 is a cross sectional view showing a cooling apparatus 1 according to a thirty-third embodiment.

The thirty-third embodiment is characterized in that a plurality of ridges 2c are provided in the upper face 2b of the refrigerant tank 2.

The upper face 2b of the refrigerant tank 2, because the cooling draft supplied by the cooling fan 30 passes over it, can constitute a condensing surface onto which vapor refrigerant condenses. Therefore, as a result of ridges 2c being provided in the upper face 2b of the refrigerant tank 2, because its surface area as a condensing surface increases and its heat transfer area increases, the cooling capacity rises.

(Thirty-fourth Embodiment)

Figure 60:
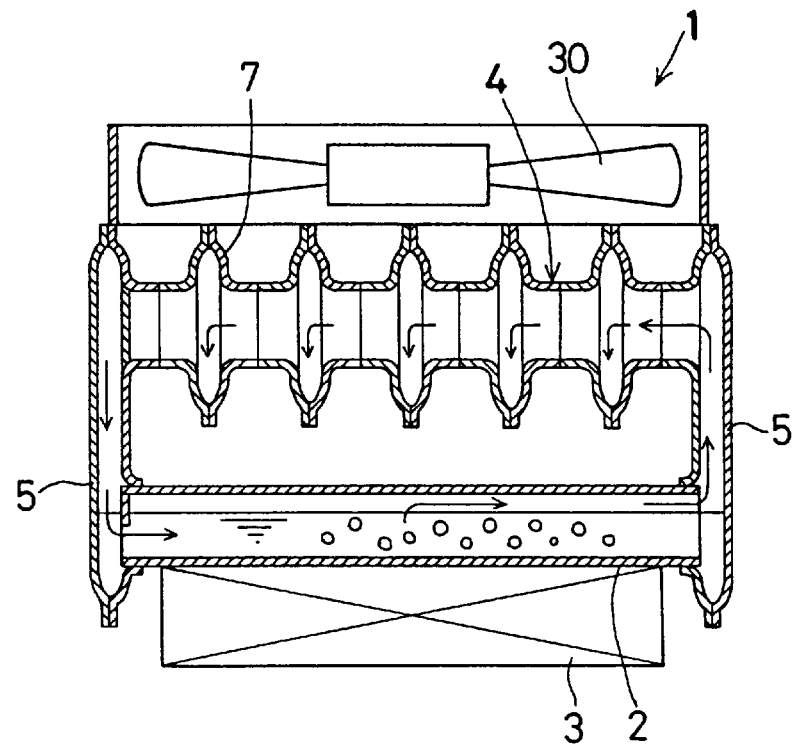
FIG. 60 is a cross sectional view showing a cooling apparatus according to a thirty-fourth embodiment.

FIG. 60 is a cross sectional view showing a cooling apparatus 1 according to a thirty-fourth embodiment.

In the cooling apparatus 1 of the thirty-fourth embodiment, as in the twenty-third embodiment, the condensing vessel 20 is made a stacked-type core. An extruded component is used for the refrigerant tank 2, and headers 5 are attached to the ends of the refrigerant tank 2 and the condensing vessel 20. In this case, because the refrigerant tank 2, the condensing vessel 20 and the headers 5 can all be stacked in one direction to assemble the overall shape, there is the merit that its ease of assembly is good and that brazeability thereof can be improved. And, as a result of an extruded component being used for the refrigerant tank 2, because it becomes easy to obtain flatness of the mounting face to which the heat-emitting body 3 is mounted, it is possible to reduce the heat resistance of contact between the refrigerant tank 2 and the heat-emitting body 3.

Figure 61:
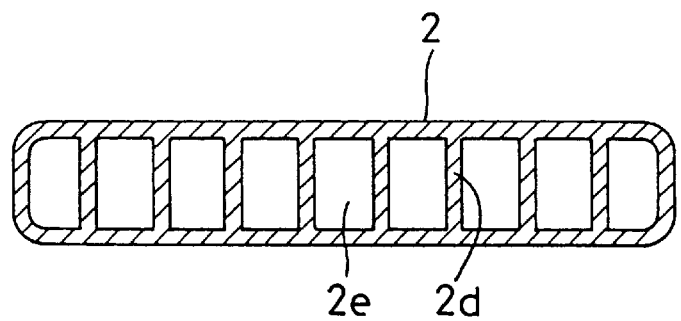
FIG. 61 is a cross sectional view showing a refrigerant tank.
Figure 62:
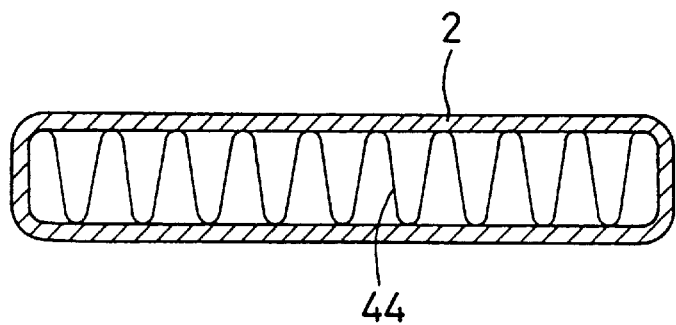
FIG. 62 is a cross sectional view showing another refrigerant tank.

If multiple refrigerant flow passages 2e divided by ribs 2d are provided inside the extruded refrigerant tank 2, as shown in FIG. 61, as well as it being possible to obtain strength with respect to refrigerant pressure there is the merit that the boiling area can be enlarged. The same effects can be obtained by inserting an inner fin 44 instead of providing ribs 2d.

(Thirty-fifth Embodiment)

Figure 63:
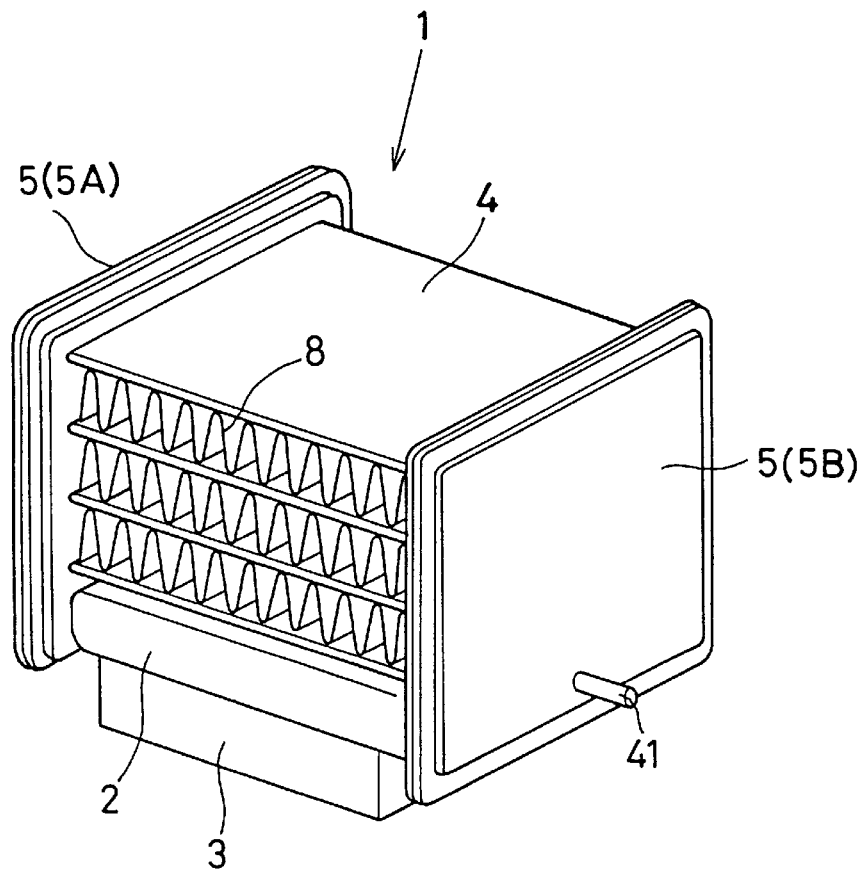
FIG. 63 is a perspective view of a cooling apparatus according to a thirty-fifth embodiment.

FIG. 63 is a perspective view showing a cooling apparatus 1 according to a thirty-fifth embodiment.

The cooling apparatus 1 of this thirty-fifth embodiment cools the heat-emitting body 3 by means of the boiling and condensing action of refrigerant, and is made up of the refrigerant tank 2 containing a liquid refrigerant, a condensing part constructed by stacking refrigerant tubes 4 and radiating fins 8 alternately in a plurality of stages, and two headers 5 (first header 5A and second header 5B) connecting the refrigerant tank 2 and the refrigerant tubes 4.

Figure 66:
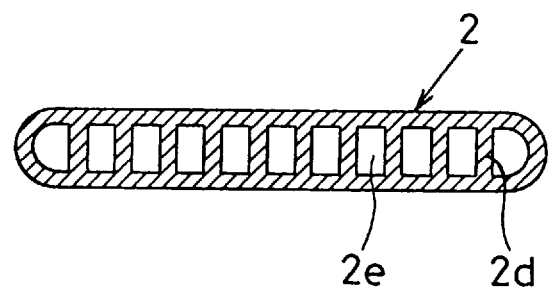
FIG. 66 is a cross sectional view showing a refrigerant tank.
Figure 67:
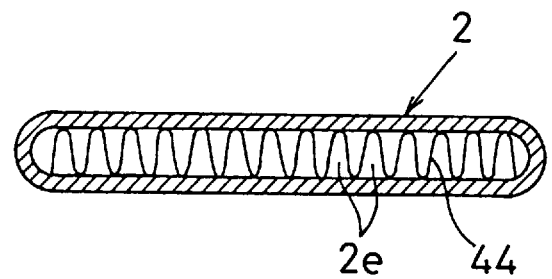
FIG. 67 is a cross sectional view showing another refrigerant tank.
Figure 68:
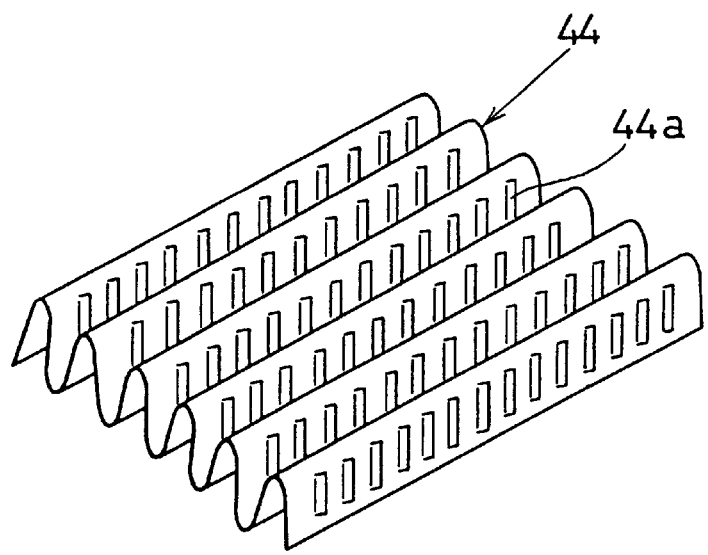
FIG. 68 is a perspective view showing an inner fin.

The refrigerant tank 2 is formed in a hollow shape with open ends using an extruded member made of aluminum, which has good thermal conductivity. A surface of the refrigerant tank 2 to which the heat-emitting body 3 is fixed has flatness to serve as a mounting face for the heat-emitting body 3. As shown in FIG. 66, multiple ribs 2d are provided inside the refrigerant tank 2, and multiple refrigerant flow passages 2e are formed by the ribs 2d. In this case, as a result of the ribs 2d being provided in the refrigerant tank 2, there is the effect that the refrigerant tank 2 has greater strength with respect to refrigerant pressure and has a larger boiling area. The same effect can be obtained by inserting a wavy inner fin 44 (a so-called corrugated fin) inside the refrigerant tank 2, as shown in FIG. 67, instead of the ribs 2d. When this inner fin 44 is used, if multiple slits 44a are formed in the fin walls, as shown in FIG. 68, the movement of the refrigerant is not restricted by the inner fin 44 and refrigerant can move around inside the refrigerant tank 2 easily.

Figure 69:
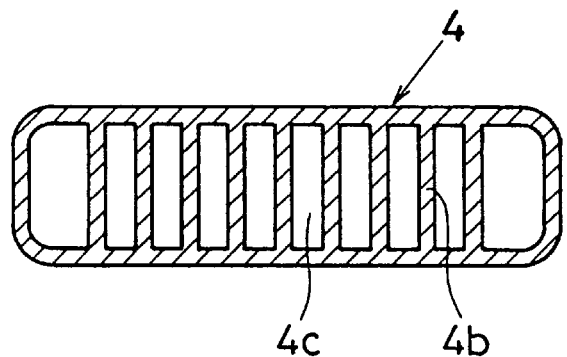
FIG. 69 is a cross sectional view showing a refrigerant tube.
Figure 70:
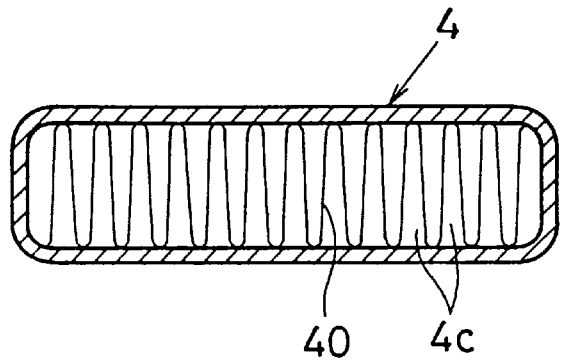
FIG. 70 is a cross sectional view showing another refrigerant tube.

The refrigerant tubes 4, like the refrigerant tank 2, are each formed in a flat hollow shape with open ends using an extruded member made of aluminum, and are of the same length as the refrigerant tank 2. The refrigerant tubes 4 are each disposed pointing in the same direction as the refrigerant tank 2 and substantially parallel with the refrigerant tank 2. Inside the refrigerant tubes 4, as shown in FIG. 69, multiple passages 4c divided by ribs 4b may be formed. In this case, as a result of the ribs 4b being provided, there is the effect that the refrigerant tubes 4 have greater strength with respect to refrigerant pressure and have a larger condensing area. The same effect can be obtained by inserting an inner fin 40 inside the refrigerant tubes 4, as shown in FIG. 70, instead of the ribs 4b.

The radiating fins 8 are made by corrugating into a wavy shape a thin sheet of a metal such as for example aluminum, and are interposed between adjacent refrigerant tubes 4.

A cooling draft is supplied by a cooling fan (not shown) to this condensing part made up of the refrigerant tubes 4 and the radiating fins 8.

The headers 5 are a first header 5A to which the refrigerant tank 2 and one open end of each of the refrigerant tubes 4 are attached and a second header 5B to which the refrigerant tank 2 and the opposite open ends of the refrigerant tubes 4 are attached.

Figure 64:
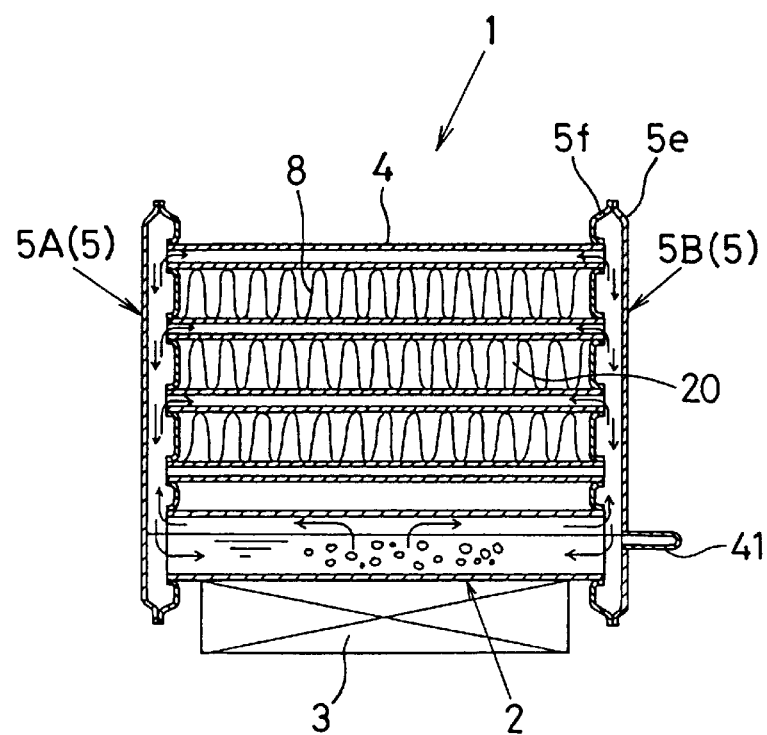
FIG. 64 is a cross sectional view showing a cooling apparatus (installed horizontally)

The headers 5 are each formed in a flat hollow shape by joining the peripheries only of two plate members 5e, 5f each press-formed in an approximately rectangular shape, and openings through which the open ends of the refrigerant tank 2 and the refrigerant tubes 4 are inserted are formed in the plate member 5f (see FIG. 64).

The heat-emitting body 3 is fixed to a central part of the bottom face of the refrigerant tank 2.

The refrigerant is filled into the refrigerant tank 2 through a filling pipe 41 attached to the second header 5B. The refrigerant is filled to a position below the upper wall of the refrigerant tank 2 at a level such that a space remains above the refrigerant liquid surface (see FIG. 64).

This cooling apparatus 1 is manufactured by assembling together the refrigerant tank 2, the condensing part 20 (the refrigerant tubes 4 and the radiating fins 8) and the headers 5 and then integrally brazing the assembly.

The operation of the thirty-fifth embodiment will be described.

a) When the cooling apparatus 1 is installed horizontally, as shown in FIG. 64:

Refrigerant boiled and vaporized by heat from the heat-emitting body 3 flows through the space above the liquid surface into the headers 5A, 5B of both sides and into the refrigerant tubes 4 from both of the headers 5A, 5B. The vapor refrigerant flowing through the refrigerant tubes 4 condenses on the inner walls of the refrigerant tubes 4 and forms liquid droplets. While being pushed by the flow of the vapor refrigerant, these liquid refrigerant move along the refrigerant tubes 4 and return through both of the headers 5A, 5B to the inside of the refrigerant tank 2 and repeat the cycle (boiling-condensing-liquefaction) again.

Figure 65:
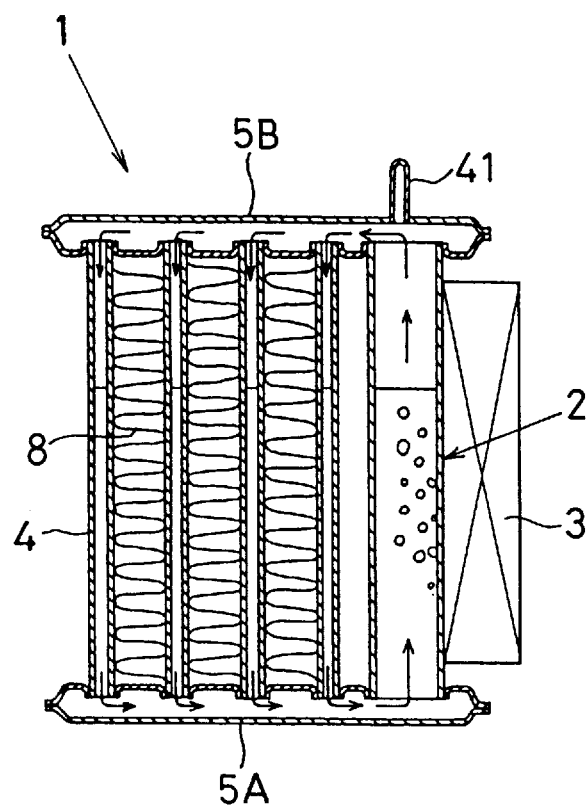
FIG. 65 is a cross sectional view showing a cooling apparatus (installed vertically)

Heat transmitted to the refrigerant from the heat-emitting body 3 is released as latent heat of condensation as the vapor refrigerant condenses inside the refrigerant tubes 4 and is emitted from the walls of the refrigerant tubes 4 through the radiating fins 8 into the outside atmosphere.

b) When the cooling apparatus 1 is installed vertically, as shown in FIG. 65:

Refrigerant boiled and vaporized by heat from the heat-emitting body 3 flows into the second header 5B positioned above the upper space inside the refrigerant tank 2 and flows from that second header 5B into the refrigerant tubes 4. The vapor refrigerant flowing through the refrigerant tubes 4 condenses on the inner walls of the refrigerant tubes 4 and forms liquid droplets, and moves downward along the inner walls of the refrigerant tubes 4 under its own weight and returns to the liquid refrigerant. The liquid refrigerant inside the refrigerant tubes 4 is supplied to the inside of the refrigerant tank 2 through the first header 5A positioned on the lower side and repeats the cycle (boiling-condensing-liquefaction) described above again.

Heat transmitted to the refrigerant from the heat-emitting body 3 is released as latent heat of condensation as the vapor refrigerant condenses inside the refrigerant tubes 4 and is emitted from the walls of the refrigerant tubes 4 through the radiating fins 8 into the outside atmosphere.

With this thirty-fifth embodiment, because extruded members are used for the refrigerant tank 2 and the refrigerant tubes 4, flatness of the mounting face of the refrigerant tank 2 to which the heat-emitting body 3 is attached can be obtained easily. Further, it is easy to make the refrigerant tubes 4 thin and thereby make their heat-radiating area large.

And, because the headers 5 are each made by joining together two press-formed components (the plate members 5e, 5f), the headers 5 can be made thin. As a result, because it is possible to make the headers 5 small, the heat-radiating area of the cooling apparatus can be made large with respect to the overall size of the apparatus.

Also, because the construction is a simple one made by just assembling the first header 5A and the second header 5B to the open ends of the refrigerant tank 2 and the refrigerant tubes 4, the manufacturing assembly is easy.

(Thirty-sixth Embodiment)

Figure 71:
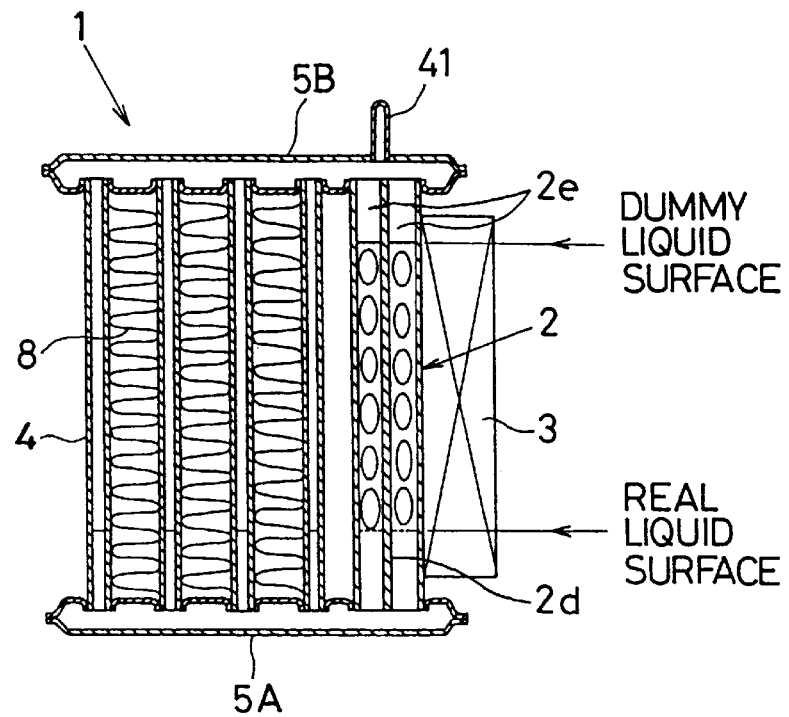
FIG. 71 is a cross sectional view showing a cooling apparatus according to a thirty-sixth embodiment.

FIG. 71 is a cross sectional view showing a cooling apparatus according to a thirty-sixth embodiment.

Figure 72:
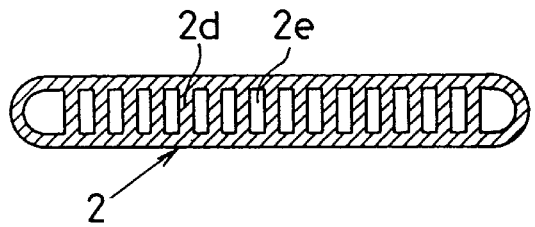
FIG. 72 is a cross sectional view showing a refrigerant tank.
Figure 73:
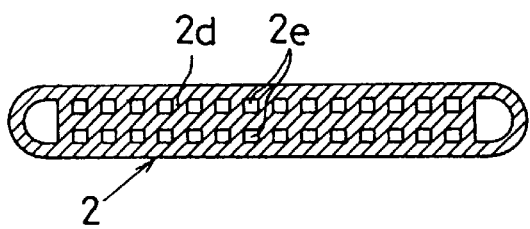
FIG. 73 is a cross sectional view showing the refrigerant tank.
Figure 74:
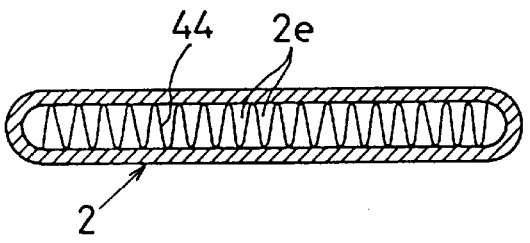
FIG. 74 is a cross sectional view showing another refrigerant tank.

The thirty-sixth embodiment shows a case wherein multiple a refrigerant flow passages 2e having small cross sectional areas (for example of flow passage width 0.5 to 1.0 mm) are formed inside the refrigerant tank 2. Specifically, as shown in FIG. 72, the gaps between ribs 2d can be made small or, as shown in FIG. 73, the refrigerant flow passages 2e can be provided in two rows to make the cross sectional areas of each of the refrigerant flow passages 2e small. Or, as shown in FIG. 74, the cross sectional areas of the refrigerant flow passages 2e can also be made small by the fin pitch of an inner fin 44 inserted into the refrigerant tank 2 being made narrow.

In this case, when the cooling apparatus 1 is installed vertically, as shown in FIG. 71, as vapor refrigerant (bubbles) rises up the refrigerant flow passages 2e, liquid refrigerant is caught by these bubbles and also rise up, and wets the boiling face (the part where the heat-emitting body 3 is mounted). That is, because the bubble diameter is slightly larger than the widths of the refrigerant flow passages 2e, the liquid refrigerant is confined by bubbles and wall faces and ascends together with the ascent of the bubbles. Therefore, as shown in FIG. 71, because apparent liquid surface can be made higher than the real liquid surface, the amount of the refrigerant sealed in the cooling apparatus can be reduced and the condensing area of the refrigerant tubes 4 covered by the liquid refrigerant thereby made small (the condensing area appearing above the liquid surface can be made large). As a result, even when the cooling apparatus 1 is installed vertically, it is possible to maintain a required cooling performance.

(Thirty-seventh Embodiment)

Figure 75:
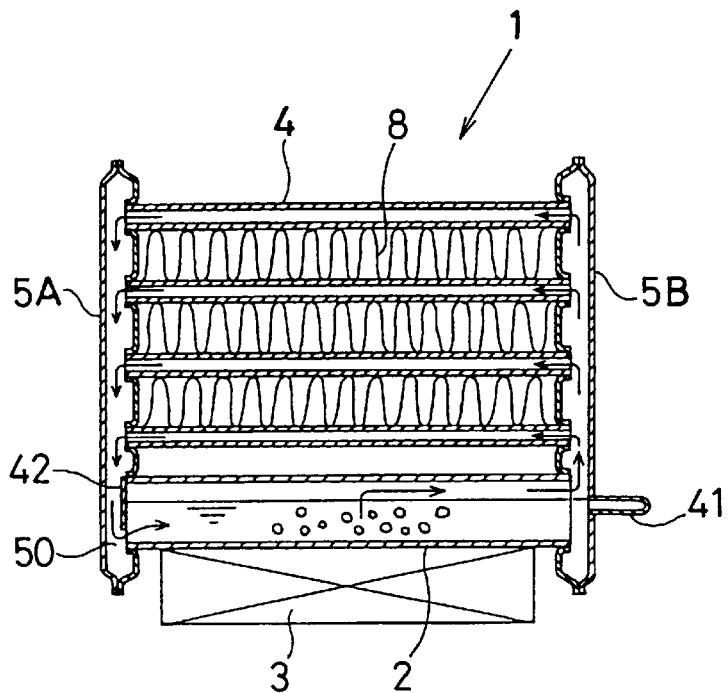
FIG. 75 is a cross sectional view showing a cooling apparatus according to a thirty-seventh embodiment.

FIG. 75 is a cross sectional view showing a cooling apparatus 1 according to a thirty-seventh embodiment.

In the thirty-seventh embodiment, a refrigerant flow control plate 42 for preventing the outflow of vapor refrigerant through one of the open ends of the refrigerant tank 2 is provided. In other words, so that only liquid refrigerant can flow through one of the open ends of the refrigerant tank 2, the upper side of this open end is blocked with a refrigerant flow control plate 42. Below the refrigerant flow control plate 42, a flow aperture 50 through which liquid refrigerant can flow between the first header 5A and the refrigerant tank 2 is provided.

As a result, vapor of the refrigerant boiled by heat from the heat-emitting body 3 inevitably flows through the upper space inside the refrigerant tank 2 to the other open end (on the right side) and flows into the second header 5B, condenses in the condensing part, and can then return through the first header 5A and the flow aperture 50 to the inside of the refrigerant tank 2. Thus there is no interference of the vapor of refrigerant boiled in the refrigerant tank 2 and the liquid refrigerant liquefied in the condensing part and refrigerant can be made to circulate naturally in one direction, whereby the cooling performance can be increased.

(Thirty-eighth Embodiment)

Figure 76:
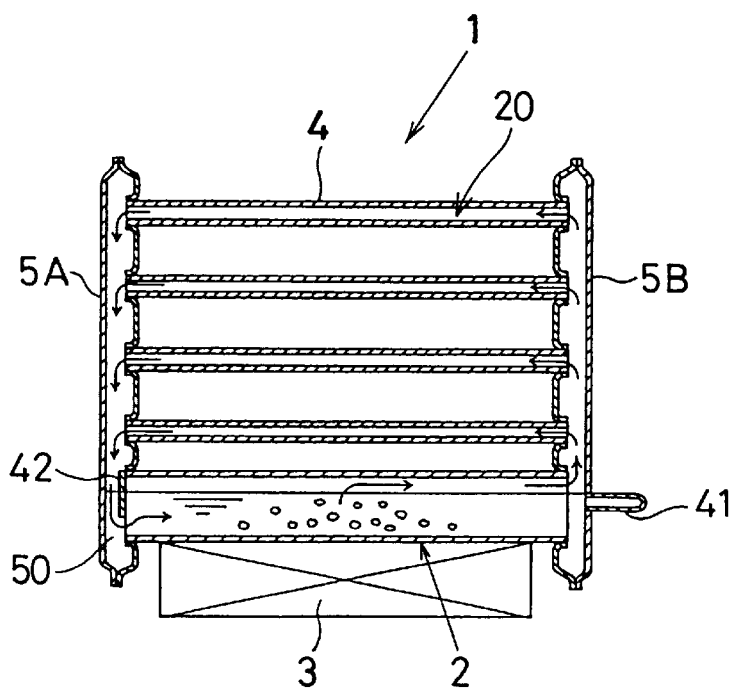
FIG. 76 is a cross sectional view showing a cooling apparatus according to thirty-eighth embodiment.

FIG. 76 is a cross sectional view showing a cooling apparatus 1 according to a thirty-eighth embodiment.

The thirty-eighth embodiment shows an example wherein the condensing vessel 20 is constructed using refrigerant tubes 4 only. That is, when the amount of heat produced by the heat-emitting body 3 is relatively small, because the required heat-radiating area also is not so large, it is possible to secure the required cooling performance without using radiating fins 8.

And, when wavy radiating fins 8 (corrugated fins) are provided, because the radiating fins 8 constitute a resistance to air flow and increase pressure loss, when a cooling fan is installed in a location away from the condensing part 20, it is necessary to provide a duct (not shown) for guiding the cooling air flow from the cooling fan to the condensing part 20. However, if the radiating fins 8 are dispensed with and the condensing vessel 20 is constructed using only refrigerant tubes 4, because there is no resistance to air flow due to the fins 8 and the pressure loss can be made small, an ample cooling air flow can be supplied to the condensing part 20 without using a duct.

(Thirty-ninth Embodiment)

Figure 77:
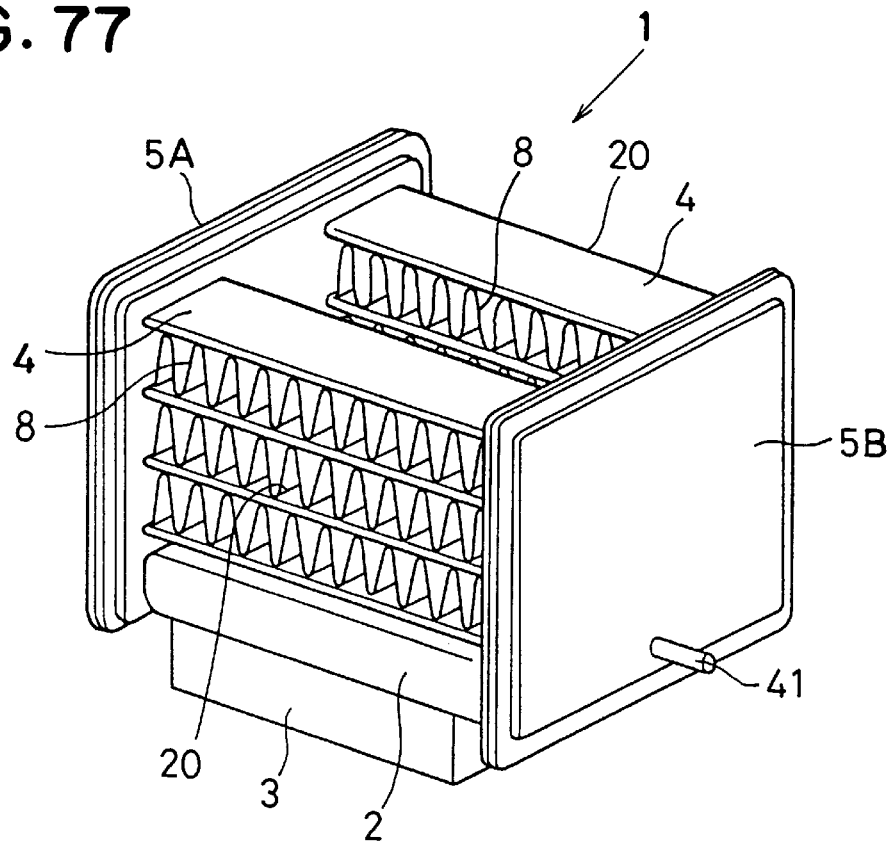
FIG. 77 is a perspective view showing a cooling apparatus according to thirty-ninth embodiment.

FIG. 77 is a perspective view showing a cooling apparatus 1 according to a thirty-ninth embodiment.

The thirty-ninth embodiment shows an example of a case wherein a plurality of condensing parts 20 (in FIG. 77, two) are provided with respect to a single refrigerant tank 2. The condensing parts 20 are lined up with a predetermined gap in the cross-width direction of the refrigerant tank 2.

Figure 78:
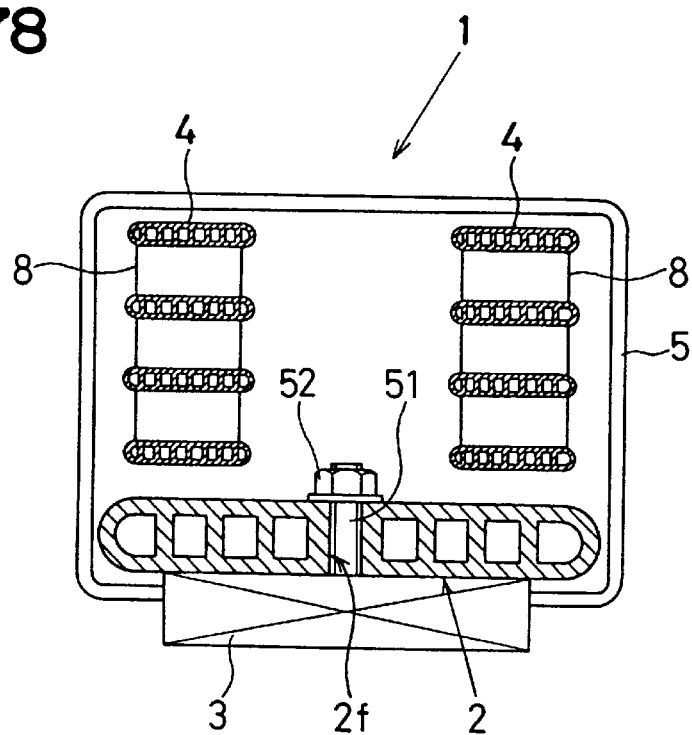
FIG. 78 is a cross sectional view showing the cooling apparatus according to the thirty-ninth embodiment.

With the construction of this thirty-ninth embodiment, the heat-emitting body 3 can be fixed to the refrigerant tank 2 easily by means of a mounting screw 51 (a male threaded screw) and a nut 52. That is, as shown in FIG. 78, the heat-emitting body 3 can be fixed to the refrigerant tank 2 by a mounting screw 51 provided A in advance on the heat-emitting body 3 being passed through a through hole 2f formed in the approximate center of the refrigerant tank 2 and a nut 52 being screwed onto the end of the mounting screw 51. In this case, because the two condensing parts 20 are lined up with a predetermined gap therebetween, this space can be utilized to carry out the operation of tightening the nut 52. Further, because the refrigerant tank 2 is an extruded member, providing the through hole 2f is also simple.

(Fortieth Embodiment)

Figure 79:
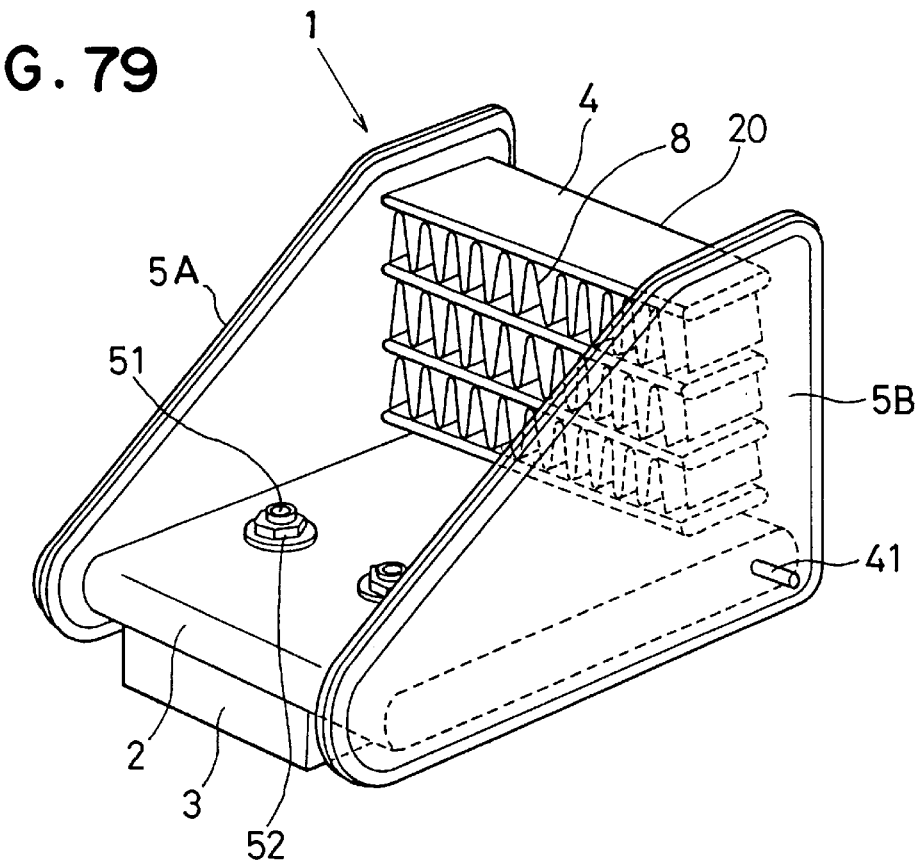
FIG. 79 is a perspective view showing a cooling apparatus according to a fortieth embodiment.

FIG. 79 is a perspective view showing a cooling apparatus 1 according to a fortieth embodiment.

In the fortieth embodiment, as shown in FIG. 79, the condensing part 20 is made small and this condensing vessel 20 is offset to one cross-width direction side with respect to the refrigerant tank 2.

When this is done it is possible to carry out the work of tightening a nut 52 onto a mounting screw 51 of the heat-emitting body 3 easily.

Figure 80:
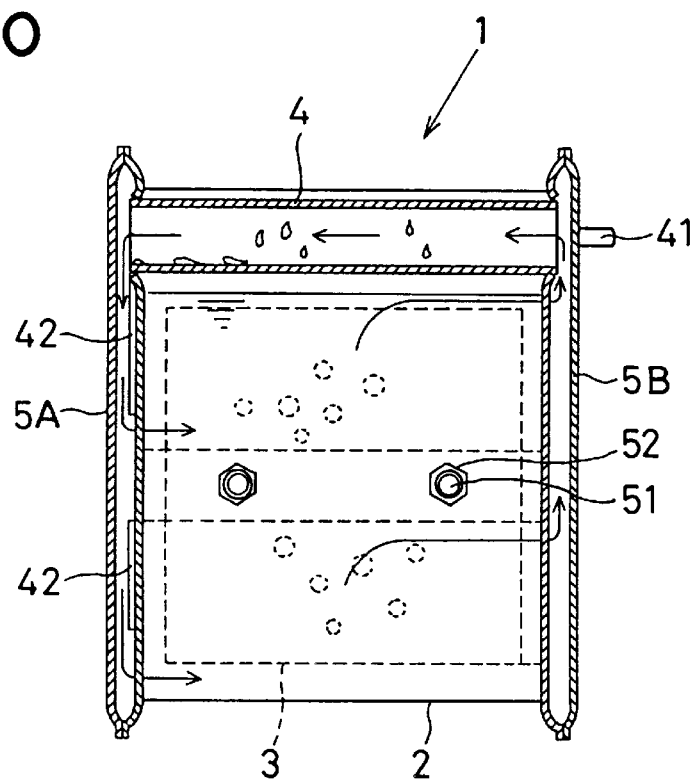
FIG. 80 is a cross sectional view showing the cooling apparatus according to the fortieth embodiment.

When the cooling apparatus 1 is installed vertically, if the condensing part 20 is disposed on the upper side, because the refrigerant tubes 4 are not filled with liquid refrigerant, a required cooling capacity can be obtained even when the condensing part 20 is made small. In this case, as in the thirty-seventh embodiment, by providing a refrigerant flow control plate 42 at one open end of the refrigerant tank 2 (the left side open end in FIG. 80), it is possible to make the refrigerant circulate naturally in one direction, as shown by the arrows in FIG. 80.

The plurality of condensing parts described in this thirty-ninth embodiment can also be thought of as the condensing part described in the thirty-fifth preferred embodiment divided up into a plurality of parts.

What is claimed is:

1. A cooling apparatus for cooling a heat-emitting body by means of heat transport effected by boiling and condensing refrigerant, comprising:

a refrigerant tank containing liquid refrigerant;

a condensing vessel having a refrigerant tube into which vapor refrigerant boiled by heat from the heat-emitting body flows, for condensing the vapor refrigerant flowing through said refrigerant tube; and a pair of connecting members connecting said refrigerant tank with said refrigerant tube, wherein said refrigerant tank and said refrigerant tube are extruded members each provided in a hollow shape having two open ends and are disposed substantially parallel and pointing in a same direction, said pair of connecting members consists of a connecting member to which one open end of said refrigerant tank and one open end of said refrigerant tube are both connected, and another connecting member to which the other open end of said refrigerant tank and the other open end of said refrigerant tube are both connected, and said connecting members are each made by joining together two press-formed components.

2. A cooling according to claim 1, wherein multiple refrigerant flow passages having small cross sectional areas are provided inside said refrigerant tank.

3. A cooling apparatus according to claim 1, wherein a refrigerant flow control plate for preventing the vapor refrigerant from flowing out through one of the open ends of said refrigerant tank is provided.

4. A cooling apparatus according to claim 1, wherein said condensing vessel is disposed offset to one side with respect to said refrigerant tank in a cross-width direction thereof.

5. A cooling apparatus according to claim 1, wherein said condensing vessel comprises a plurality of such refrigerant tubes and said refrigerant tubes are disposed in parallel with fixed gaps therebetween.

* * * * *